(12) United States Patent
Isobe

(10) Patent No.: US 9,207,491 B2
(45) Date of Patent: Dec. 8, 2015

(54) LED LIGHT SOURCE AND METHOD OF MANUFACTURING THE SAME

(71) Applicant: Renesas Electronics Corporation, Kawasaki-shi, Kanagawa (JP)

(72) Inventor: Hiroyuki Isobe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/226,817

(22) Filed: Mar. 26, 2014

(65) Prior Publication Data

US 2014/0204312 A1 Jul. 24, 2014

Related U.S. Application Data

(63) Continuation of application No. 13/432,943, filed on Mar. 28, 2012, now Pat. No. 8,704,245, which is a continuation of application No. 12/067,413, filed as application No. PCT/JP2005/017291 on Sep. 20, 2005, now Pat. No. 8,168,989.

(51) Int. Cl.
| | |
|---|---|
| *G02F 1/1335* | (2006.01) |
| *H01L 33/36* | (2010.01) |
| *H01L 33/08* | (2010.01) |
| *F21K 99/00* | (2010.01) |
| *H01L 23/00* | (2006.01) |
| *F21Y 101/02* | (2006.01) |
| *F21Y 103/00* | (2006.01) |

(Continued)

(52) U.S. Cl.
CPC ............ *G02F 1/133603* (2013.01); *F21K 9/90* (2013.01); *G02F 1/133621* (2013.01); *H01L 24/97* (2013.01); *H01L 33/08* (2013.01); *H01L 33/36* (2013.01); *F21Y 2101/02* (2013.01); *F21Y 2103/003* (2013.01); *F21Y 2113/005* (2013.01); *H01L 25/0753* (2013.01); *H01L 2224/48091* (2013.01); *H01L 2224/48247* (2013.01); *H01L 2224/48465* (2013.01); *H01L 2924/12041* (2013.01)

(58) Field of Classification Search
None
See application file for complete search history.

(56) References Cited

U.S. PATENT DOCUMENTS

| 3,875,456 A | 4/1975 | Kano et al. |
| 3,914,786 A | 10/1975 | Grossi |

(Continued)

FOREIGN PATENT DOCUMENTS

| JP | 60-113655 A | 8/1985 |
| JP | 61-95583 A | 5/1986 |

(Continued)

OTHER PUBLICATIONS

Taiwanese Office Action dated Dec. 25, 2012 issued in counterpart Taiwanese Patent Application No. 095127290 (and English Translation).

(Continued)

*Primary Examiner* — Ha Tran T Nguyen
*Assistant Examiner* — Jordan Klein
(74) *Attorney, Agent, or Firm* — Miles & Stockbridge P.C.

(57) ABSTRACT

After the LEDs 2 (red LEDs (R), green LEDs (G) and blue LEDs (B), or white LEDs (W)) are mounted on the frame 3, without dicing the frame 3 for dividing the LEDs 2 into pieces, the tie bar is punched off to form an electric circuit. Thus, the RGB three primary color LED light source 1A or the white LED light source 1B that emits light in the state of the frame 3 can be manufactured.

10 Claims, 25 Drawing Sheets

(51) Int. Cl.
*F21Y 113/00* (2006.01)
*H01L 25/075* (2006.01)

(56) References Cited

U.S. PATENT DOCUMENTS

| | | | |
|---|---|---|---|
| 4,630,183 A | 12/1986 | Fujita | |
| 4,992,704 A * | 2/1991 | Stinson | 315/312 |
| 5,059,373 A | 10/1991 | Hirabayashi | |
| 5,218,233 A * | 6/1993 | Takahashi | 257/787 |
| 5,324,962 A * | 6/1994 | Komoto et al. | 257/89 |
| 5,491,349 A | 2/1996 | Komoto et al. | |
| 5,841,177 A * | 11/1998 | Komoto et al. | 257/431 |
| 5,942,770 A | 8/1999 | Ishinaga et al. | |
| 6,093,940 A | 7/2000 | Ishinaga et al. | |
| 6,335,548 B1 | 1/2002 | Roberts et al. | |
| 6,376,902 B1 | 4/2002 | Arndt | |
| 6,483,623 B1 | 11/2002 | Maruyama | |
| 6,495,860 B1 | 12/2002 | Yu | |
| 6,498,440 B2 * | 12/2002 | Stam et al. | 315/291 |
| 6,547,249 B2 | 4/2003 | Collins et al. | |
| 6,547,416 B2 * | 4/2003 | Pashley et al. | 362/231 |
| 6,552,368 B2 | 4/2003 | Tamai et al. | |
| 6,621,223 B1 | 9/2003 | Hen | |
| 6,828,170 B2 | 12/2004 | Roberts et al. | |
| 6,921,927 B2 | 7/2005 | Ng et al. | |
| 6,936,855 B1 | 8/2005 | Harrah | |
| 7,002,546 B1 | 2/2006 | Stuppi et al. | |
| 7,161,190 B2 | 1/2007 | Chikugawa | |
| 7,201,511 B2 | 4/2007 | Moriyama et al. | |
| 7,238,966 B2 | 7/2007 | Nakata | |
| 7,317,181 B2 | 1/2008 | Murakami et al. | |
| 7,560,738 B2 | 7/2009 | Liu | |
| 2002/0089047 A1 | 7/2002 | Arndt | |
| 2002/0158261 A1 | 10/2002 | Lee et al. | |
| 2003/0025170 A1 | 2/2003 | Arndt | |
| 2003/0189236 A1 | 10/2003 | Arndt | |
| 2003/0189829 A1 | 10/2003 | Shimizu et al. | |
| 2003/0218689 A1 | 11/2003 | Angeli et al. | |
| 2004/0027041 A1 * | 2/2004 | Nishikawa | 313/110 |
| 2004/0080938 A1 * | 4/2004 | Holman et al. | 362/231 |
| 2004/0238930 A1 | 12/2004 | Arndt | |
| 2006/0197103 A1 | 9/2006 | Arndt | |
| 2007/0126098 A1 | 6/2007 | Arndt | |

FOREIGN PATENT DOCUMENTS

| | | |
|---|---|---|
| JP | 3-171782 A | 7/1991 |
| JP | 5315653 A | 11/1993 |
| JP | 2000-114553 A | 4/2000 |
| JP | 2001-518692 A | 10/2001 |
| JP | 2001-332769 A | 11/2001 |
| JP | 2004-55229 A | 2/2004 |
| JP | 2004-257801 A | 9/2004 |
| TW | 588470 B | 5/2004 |
| TW | 200425542 A | 11/2004 |

OTHER PUBLICATIONS

Japanese Office Action dated Dec. 18, 2012 issued in counterpart Japanese Patent Application 2011-238416 (and English Translation).

Japanese Office Action received in Japanese App. No. 2007-536358 (and English translation thereof).

Office Action issued Oct. 28, 2014, in Taiwan Patent Application No. 102110869.

* cited by examiner

LED LIGHT SOURCE AND METHOD OF
MANUFACTURING THE SAME

CROSS-REFERENCE TO RELATED
APPLICATIONS

This application is a continuation of application Ser. No. 13/432,943 filed Mar. 28, 2012, which is a continuation of application Ser. No. 12/067,413 filed Mar. 19, 2008, which is a 371 of International Application No. PCT/JP2005/017291 filed Sep. 20, 2005.

TECHNICAL FIELD

The present invention relates to a light emitting diode (LED) light source and a manufacturing technology of the same. More particularly, it relates to a technology effectively applied to an LED light source using a visible LED.

BACKGROUND ART

In recent years, with the increase in brightness of LEDs, the LEDs have been used widely in a backlight and a flashlight of a liquid crystal display of a cellular phone, traffic signals, a light source of an office automation equipment such as a printer, and a lighting device and so forth.

For example, an LED light source device in which heat generated from each of the plural packaged LEDs is dissipated by a heat sink and heat can be efficiently transmitted to a chassis of an attached lighting device has been disclosed (for example, refer to Patent Document 1).

Patent Document 1: Japanese Patent Application Laid-Open Publication No. 2004-55229 (paragraphs [0024] to [0025], FIG. 1)

DISCLOSURE OF THE INVENTION

Problem to be Solved by the Invention

One piece of LED is a point light source that emits a light flux from a 0.2 to 3 mm cube, and the light flux emitted from one piece of LED is as small as 1 to 2 lumens. Therefore, in the case where the LED is used as an illumination light source, in order to compensate for the insufficient illumination or in order to illuminate a wide area, a plurality of LEDs are collectively used. For instance, when LEDs are used for the backlight of a 32-inch liquid crystal screen, 960 pieces of fragmented LEDs are required, and the desired brightness can be obtained by arbitrarily mounting these fragmented LEDs on a printed wiring board. By sending out light fluxes emitted from LEDs efficiently and in one direction at a wide angle, a uniform bright liquid crystal screen can be attained.

However, when a fluorescent lamp and LEDs with the same light emitting efficiency are compared in only simple numerical values, the price of the illumination light source using a plurality of LEDs is higher than that of the illumination light source using a single fluorescent lamp, and accordingly, as a problem to be solved in the LED light source in the future, it is required to attain the price reduction of the LED light source. Since an LED light source is manufactured by mounting many fragmented LEDs on a printed wiring board individually, enormous mounting time and mounting processes are necessary. This is one of the causes of the high price of an LED light source.

Accordingly, an object of the present invention is to provide a technology capable of realizing the price reduction of an LED light source.

The above and other objects and novel characteristics of the present invention will be apparent from the description of this specification and the accompanying drawings.

Means for Solving the Problems

The typical ones of the inventions disclosed in this application will be briefly described as follows.

The LED light source according to the present invention has a frame in which one row or two or more rows of a base frame comprising: a plurality of die bonding areas arranged at specified intervals in a first direction; a plurality of wire bonding areas arranged to be opposed to the die bonding areas in the first direction; a first lead connected to the die bonding areas and extending in the first direction; and a second lead connected to the wire bonding areas and extending in the first direction are arranged in a second direction vertical to the first direction, a plurality of LEDs are mounted on the frame, and the LED light source emits light in a state of the frame.

The method of manufacturing an LED light source according to the present invention comprises the steps of: adhering LED chips onto a plurality of die bonding areas of a frame; connecting the opposed LED chips and wire bonding areas by use of bonding wires; resin-sealing the LED chips, the die bonding areas, the bonding wires, and the wire bonding areas, thereby forming LEDs; and punching out a plurality of tie bars provided in the frame.

Effect of the Invention

The effects obtained by typical aspects of the present invention will be briefly described below.

After a plurality of LEDs are mounted on a frame, a tie bar is punched out, and an LED light source that lights on in a frame state is manufactured. By this means, in comparison with the LED light source manufactured by arbitrarily mounting fragmented LEDs on a wiring board, the manufacturing process is shortened. Also, since the various materials necessary for mounting become unnecessary, it is possible to reduce the material cost and realize the price reduction of the LED light source.

BEST MODE FOR CARRYING OUT THE INVENTION

Figure 1:
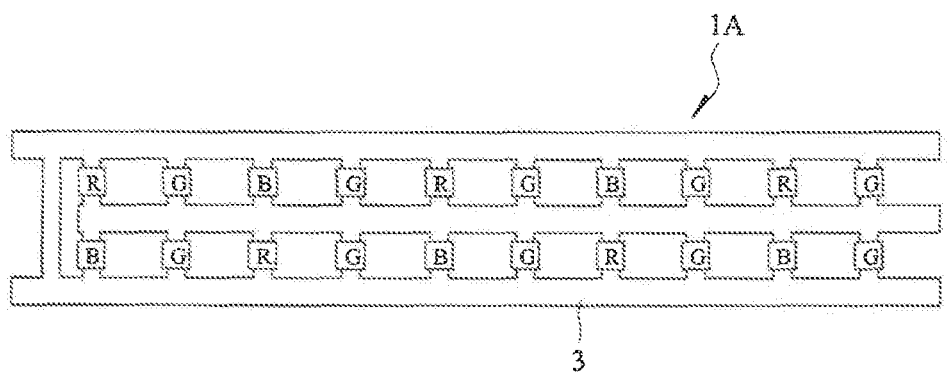
FIG. 1 is a plan view showing a substantial part of an LED light source using red LEDs, green LEDs, and blue LEDs according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, in the embodiments below, the frame means a metal frame in which one row or two or more rows of a base frame comprising: a plurality of die bonding areas that are arranged at specified intervals in a first direction; a plurality of wire bonding areas that are arranged to be opposed to the die bonding areas in the first direction; a first lead that is connected to the die bonding areas and extends in the first direction; and a second lead that is connected to the wire bonding areas and extends in the first direction are repeatedly formed in a second direction.

Furthermore, in the drawings used in the embodiments, hatching is used in some cases even in a plan view so as to make the drawings easy to see. Further, components having the same function are denoted by the same reference symbols throughout the drawings for describing the embodiments, and the repetitive description thereof will be omitted. Hereinafter, embodiments of the present invention will be described in detail with reference to drawings.

First Embodiment

Figure 2:
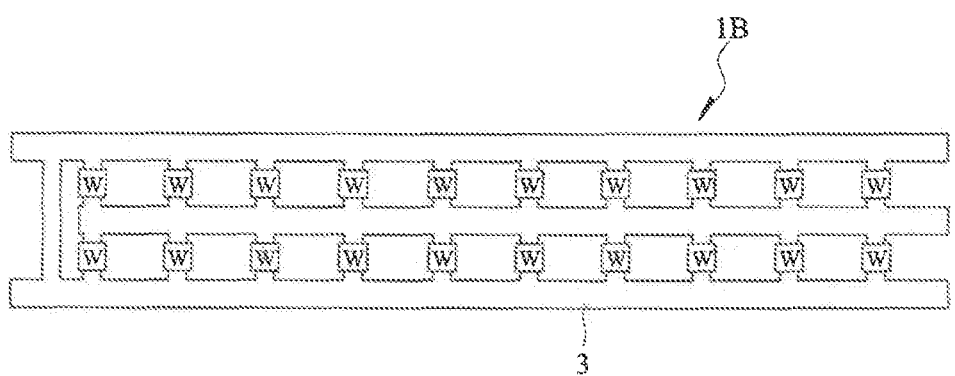
FIG. 2 is a plan view showing a substantial part of an LED light source using white LEDs composed of blue LED chips covered with phosphors according to the first embodiment of the present invention.

The structure of an LED light source according to a first embodiment will be described with reference to FIG. 1 and FIG. 2. FIG. 1 is a plan view showing a substantial part of an LED light source 1A using three LEDs of RGB three primary colors, that is, a red LED (R), a green LED (G), and a blue LED (B) (hereinafter, simply referred to as RGB three primary color LED light source), and FIG. 2 is a plan view showing a substantial part of an LED light source 1B using white LEDs (W) composed of blue LED chips covered with phosphors (hereinafter, simply referred to as white LED light source). Since peaks of light emitting spectrum of respective colors appear conspicuously in the RGB three primary color LED light source 1A, bright colors are obtained, and reproducibility of colors is favorable. Since white light emission is configured of a single LED in the white LED light source 1B, the distance between the white LED light source 1B and a diffusion plate 10 can be shortened, and a thickness of a backlight 4 can be reduced (for example, thickness about 0.35 mm) in comparison with the case where the RGB three primary color LED light source 1A is used.

The RGB three primary color LED light source 1A is a band-shaped light emitter in which a plurality of red LEDs (R), green LEDs (G), and blue LEDs (B) are arranged at arbitrary intervals, and the white LED light source 1B is a band-shaped light emitter in which a plurality of white LEDs (W) are arranged at arbitrary intervals. Also, as a substrate for the RGB three primary color LED light source 1A and the white LED light source 1B, a frame 3 from which a tie bar is removed is used. Further, although the number of rows of the base frame is two rows in the frame 3 shown in FIG. 1 and FIG. 2, the number of rows may be changed to one row or three or more rows.

Figure 3:
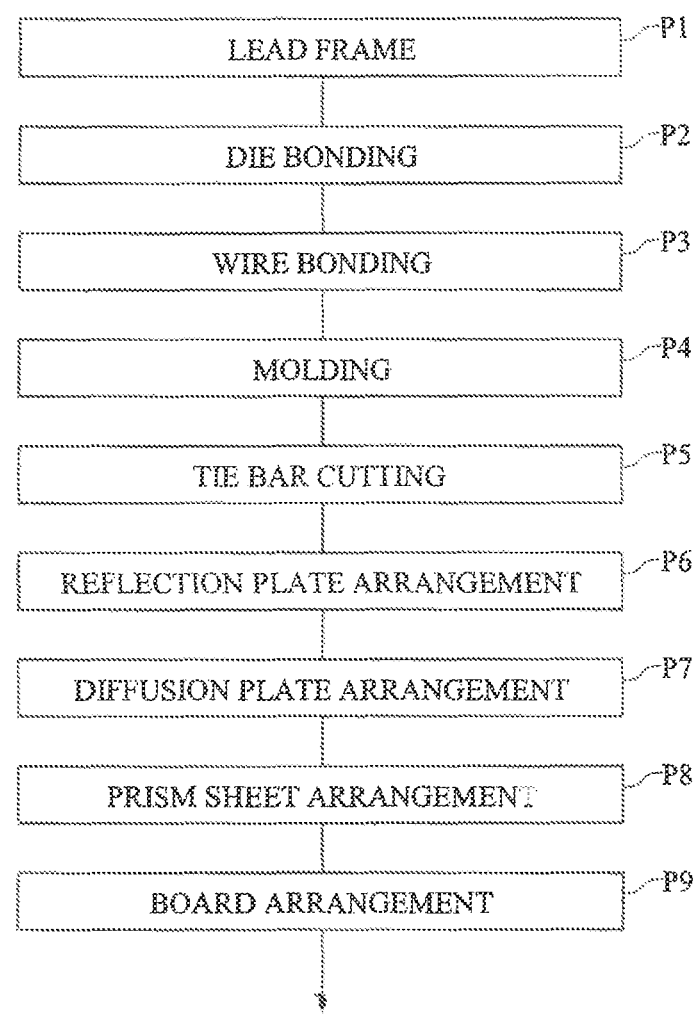
FIG. 3 is a process chart showing the manufacturing method of a backlight according to the first embodiment of the present invention.
Figure 4A:
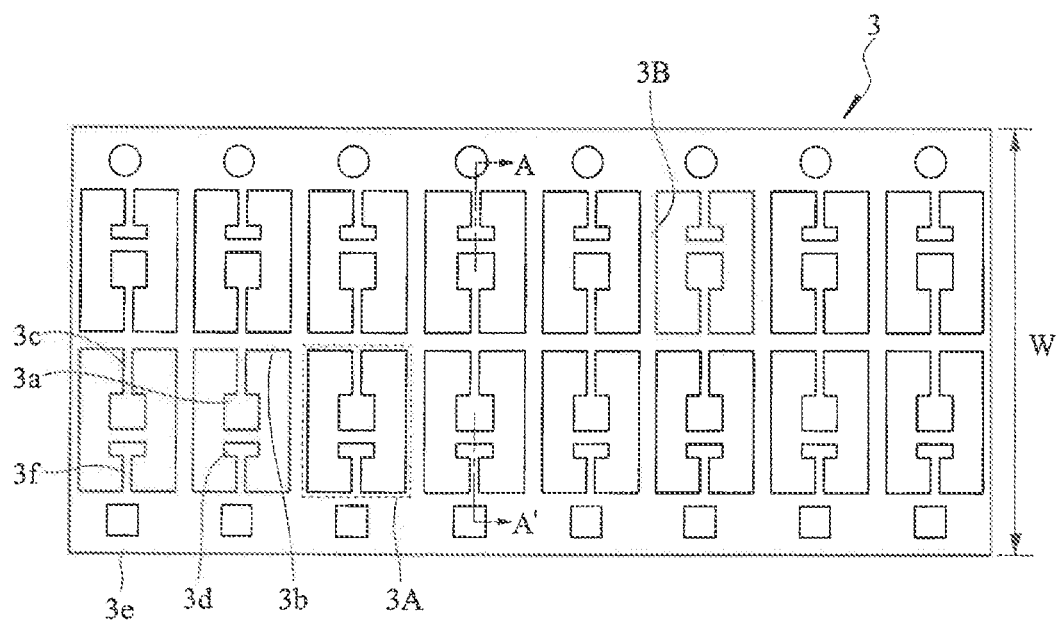
FIG. 4A and FIG. 4B are a plan view and a cross sectional view showing a substantial part of a two-row frame according to the first embodiment of the present invention.
Figure 4B:
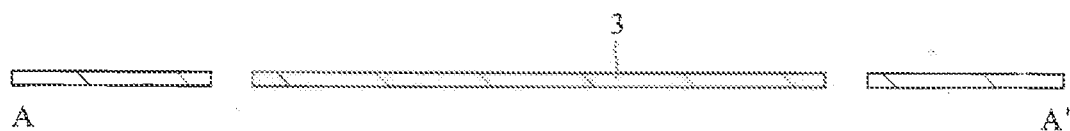

The manufacturing method of a backlight configured of the RGB three primary color LED light source according to the first embodiment will be described with reference to FIG. 3 to FIG. 6 in the order of processes. FIG. 3 is a process chart showing the manufacturing method of the backlight, FIG. 4A is a plan view showing a substantial part of a two-row frame 3, FIG. 4B is a cross sectional view showing the substantial part of the two-row frame 3 taken along the line A-A' in FIG. 4A, FIG. 5A to FIG. 5D are cross sectional views showing a substantial part of the RGB three primary color LED light source 1A in respective manufacturing processes, and FIG. 6A to FIG. 6D are cross sectional views showing a substantial part of the backlight 4 in respective manufacturing processes. Further, FIG. 7 is a schematic diagram showing a transmission type liquid crystal display device 5 having the backlight 4.

First, as shown in FIG. 4A and FIG. 4B, a frame 3 is prepared, which comprises: a plurality of product areas 3A each having a die bonding area 3a on which an LED chip is mounted, a first suspending lead 3c that connects the die bonding area 3a and a first lead 3b, a wire bonding area 3d that is arranged so as to be opposed to the die bonding area 3a, and a second suspending lead 3f that connects the wire bonding area 3d and a second lead 3e; and tie bars 3B that are arranged between the plurality of product areas 3A. The base material of the frame 3 is, for example, copper (Cu), and silver (Ag) is plated on the surface thereof (process P1 in FIG. 3). Also, the thickness of the frame 3 is, for example, about 100 to 300 μm, and the width thereof (width shown by W in FIG. 4A) is, for example, about 15 to 20 mm.

Figure 5A:
FIG. 5A to FIG. 5D are cross sectional views showing a substantial part of an LED light source in respective manufacturing processes according to the first embodiment of the present invention.

Next, as shown in FIG. 5A, after a paste material is applied onto one end (die bonding area) of the frame 3, an LED chip 2c is lightly pressed onto the paste material, and the paste material is hardened at a temperature of about 100 to 200° C. By this means, the LED chip 2c and the frame 3 are mechanically fixed and also electrically connected (process P2 in FIG. 3).

The LED chip 2c is, for example, a GaP-series LED chip. The LED chip 2c can be formed in unit of chip on a semiconductor wafer in the manufacturing process called a front-end process or a diffusion process in the following manner. For example, on a semiconductor substrate (a semiconductor thin plate in a flat roughly circular shape called a semiconductor wafer at this stage) made of single crystal GaP (or single crystal GaAs), an n type semiconductor layer and a p type semiconductor layer are sequentially deposited by an epitaxial crystal growth method to form a light emitting layer. Then, the rear surface of the semiconductor substrate is polished, so that the thickness of the semiconductor substrate is reduced to the specified thickness, and the rear surface of the semiconductor substrate is further polished. Thereafter, after a p-side electrode to be electrically connected to the p type semiconductor layer and an n-side electrode to be electrically connected to the semiconductor substrate are formed, the electrical and optical characteristics of the respective LED chips 2c are measured. For example, after the semiconductor substrate is placed on a measurement stage, a probe (exploring needle) is brought into contact with the p-side electrode to input a signal waveform from an input terminal. By doing so, the signal waveform is outputted from an output terminal. By reading the outputted signal waveform by a tester, characteristics of each LED chip 2c are obtained. Thereafter, the semiconductor substrate is diced and divided into LED chips 2c about 0.2 to 3 mm on a side.

Figure 5B:
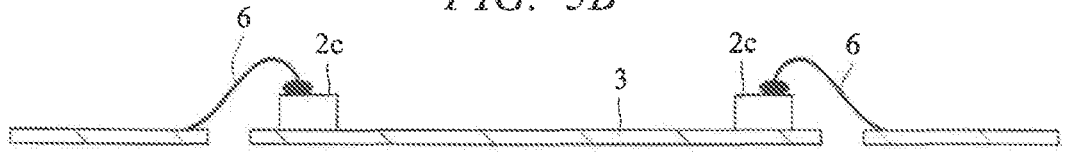

Next, as shown in FIG. 5B, the other end (wire bonding area) of the frame 3 opposed to the LED chip 2c and the p-side electrode are connected by the use of a bonding wire 6 (process P3 in FIG. 3). At this moment, the bonding wire 6 has a shape of a raised loop so as not to be in contact with the peripheral portion of the LED chip 2c.

Figure 5C:
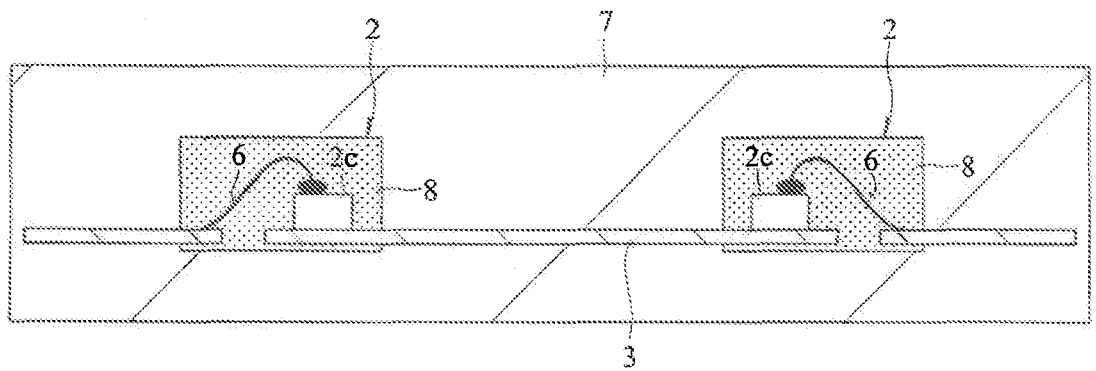
Figure 5D:
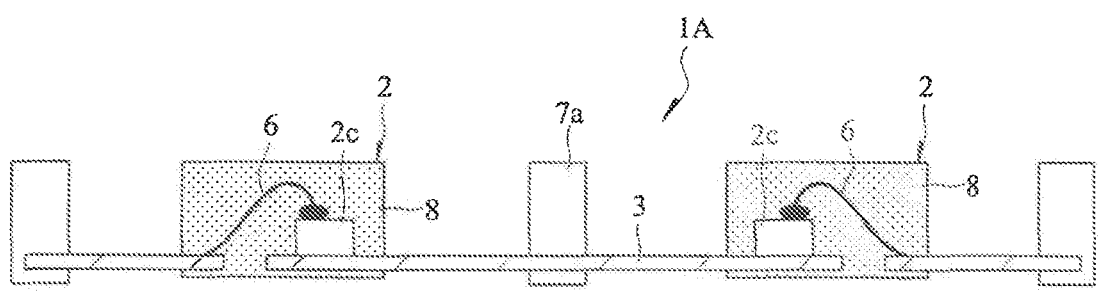

Next, as shown in FIG. 5C, after the frame 3 is set to a metal mold 7, resin 8 liquefied by heating is fed by pressure and poured into the metal mold 7, and the LED chip 2c, the die bonding area, the bonding wire 6 and the wire bonding area are sealed by the resin 8, thereby forming an LED 2 (process P4 in FIG. 3). Subsequently, excessive resin 8 and burrs are removed. Next, as shown in FIG. 5D, the tie bar of the frame 3 is punched out by the use of a cutter 7a (process P5 in FIG. 3). In this manner, the RGB three primary color LED light source 1A shown in FIG. 1 is almost completed.

Figure 6A:
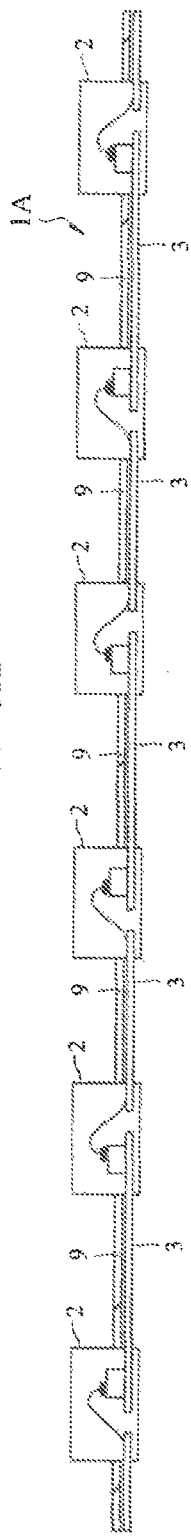
FIG. 6A to FIG. 6D are cross sectional views showing a substantial part of a backlight in respective manufacturing processes according to the first embodiment of the present invention.
Figure 6B:
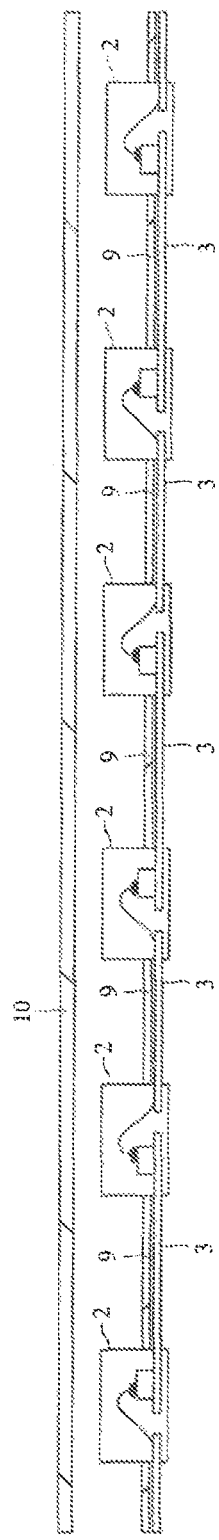
Figure 7:
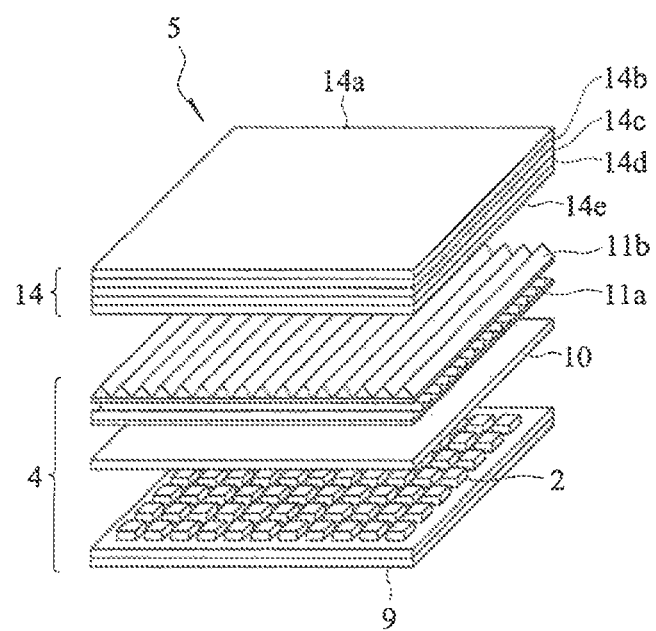
FIG. 7 is a schematic diagram showing a transmission type liquid crystal display device having the backlight according to the first embodiment of the present invention.

Next, as shown in FIG. 6A, reflection plates 9 are fit between the adjacent LEDs 2 on the illumination surface side of the RGB three primary color LED light source 1A (process P6 in FIG. 3). In general, when the LED light source generates heat, its light emission efficiency declines, and color unevenness occurs. Therefore, for example, in order to prevent light from leaking to the rear surface and increase the light emission efficiency of the LED light source, the reflection plates made of a sheet (film or plate) are arranged. Subsequently, as shown in FIG. 6B, a diffusion plate 10 of the RGB three primary color LED light source 1A is arranged on the illumination surface side (process P7 in FIG. 3). The diffusion plate 10 is a semi-transparent sheet (film or plate) to scatter or diffuse light and is used mainly for attaining uniform brightness on the entire wide surface.

Figure 6C:
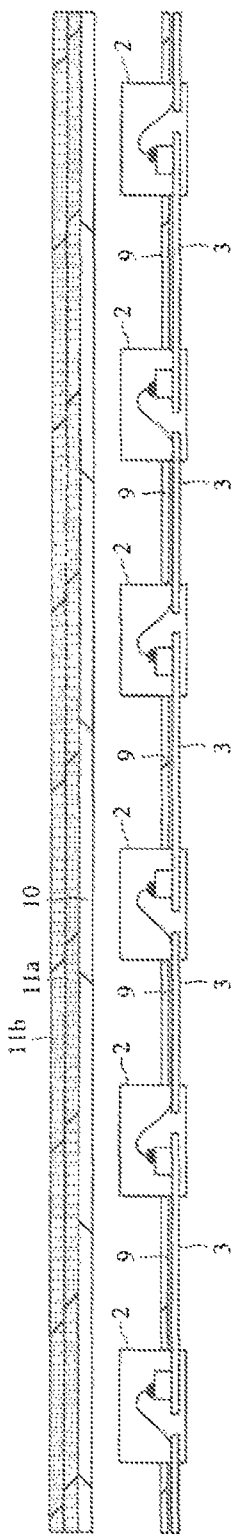
Figure 6D:
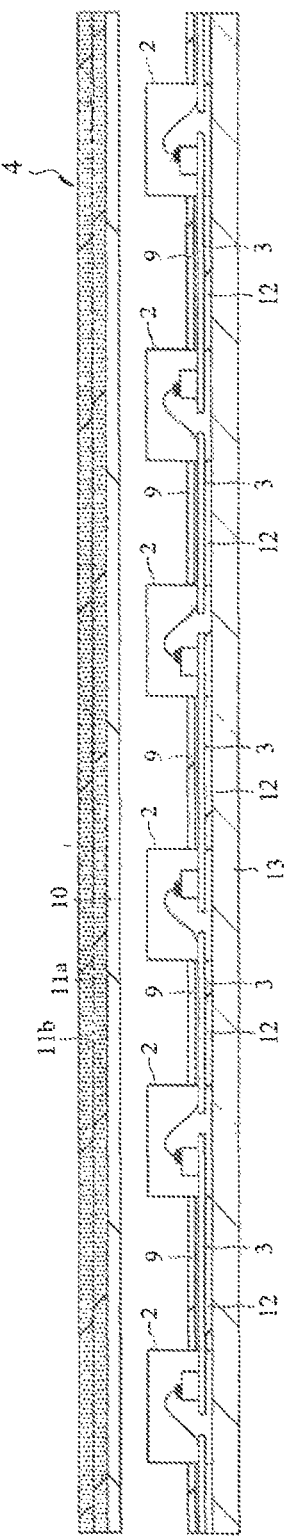

Next, as shown in FIG. 6C, prism sheets 11a and 11b are arranged on the diffusion plate 10 (process P8 in FIG. 3). The prism sheets 11a and 11b are sheets (film or plate) having a forward light condensing effect, and the cross section thereof may be of a saw tooth shape or a concave and convex shape. Thereafter, as shown in FIG. 6D, a board 13 is arranged on the rear surface of the RGB three primary color LED light source 1A via an insulation film 12 (process P9 in FIG. 3). In this manner, the backlight 4 is almost completed. The board 13 is, for example, an aluminum (Al) plate, and it has a function to hold the RGB three primary color LED light source 1A and a function as a heat dissipation plate.

Thereafter, as shown in FIG. 7, the backlight 4 is arranged on the rear surface of the liquid crystal display element 14. By this means, a liquid crystal display device 5 having the backlight 4 therein is almost completed. The liquid crystal display element 14 mentioned above is configured by the lamination of, for example, a polarizing plate 14a, a liquid crystal element 14b, a color filter 14c, a polarizing plate 14d and a half mirror 14e. The polarizing plate 14a is a plate or a film that limits the vibration of light waves in one direction, and the color filter 14c is a filter that displays the RGB three primary colors.

The manufacturing method of the backlight 4 to which the RGB three primary color LED light source 1A is mounted has been described in FIG. 6A to FIG. 6D, and a backlight to which the white LED light source 1B is mounted can be manufactured by the same method.

As described above, in the first embodiment, after the LEDs 2 (red LEDs (R), the green LEDs (G) and blue LEDs (B), or white LEDs (W)) are mounted on the frame 3, without dicing the frame 3 into the fragmented LEDs 2, the tie bar is removed to form an electric circuit. By this means, the RGB three primary color LED light source 1A or the white LED light source 1B that emits light in the state of the frame 3 is manufactured. Consequently, in comparison with the LED light source that is manufactured by cutting out LEDs from a lead frame and arbitrarily mounting fragmented LEDs on a wiring board, the manufacturing processes can be shortened, and the material cost can be reduced because the wiring board and the paste material for adhering the LEDs onto the wiring board and the like become unnecessary. As a result, it is possible to realize the price reduction of the RGB three primary color LED light source 1A or the white LED light source 1B.

(Frame Shape)

In FIG. 4A and FIG. 4B shown above, the two-row frame 3 in which the die bonding areas and the tie bars are arranged alternately has been illustrated as an example. However, the shape of the frame is not limited to this. Hereinafter, various shapes of the frame according to the first embodiment will be illustrated in FIG. 8 to FIG. 13.

Figure 8A:
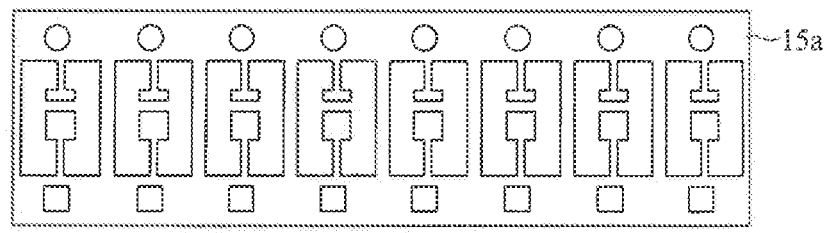
FIG. 8A to FIG. 8C are plan views showing a substantial part of one-row, two-row, and three-row first frames according to the first embodiment of the present invention.
Figure 8B:
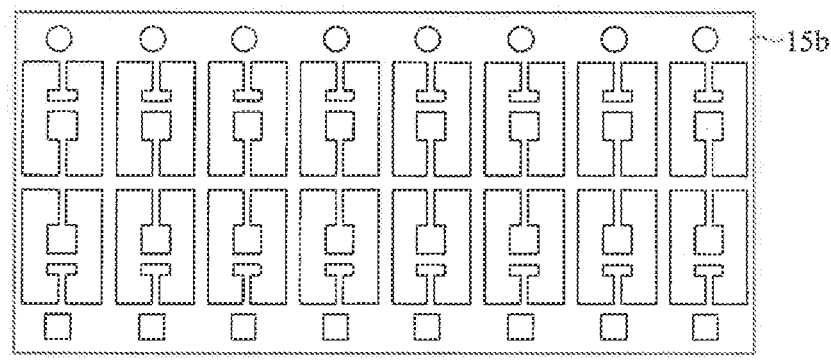
Figure 8C:
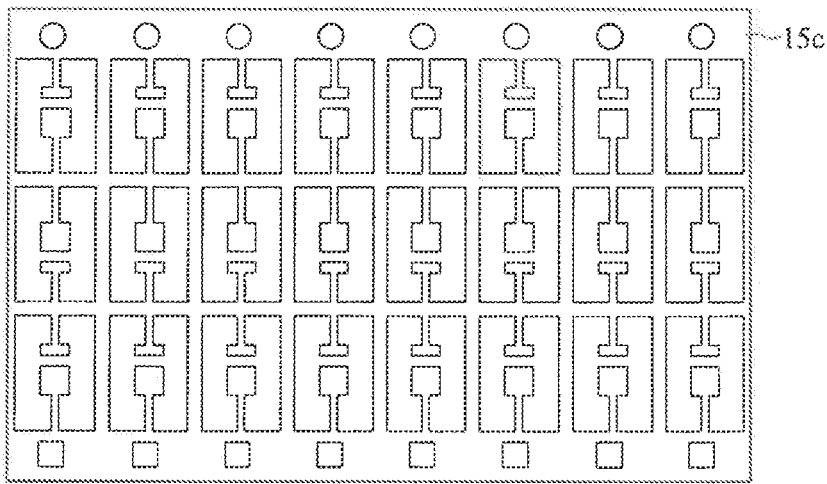
Figure 9A:
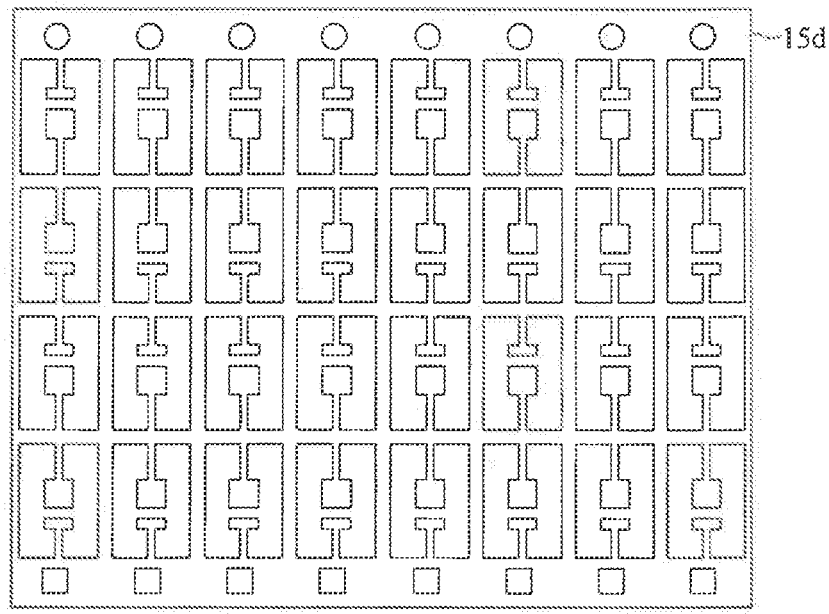
FIG. 9A and FIG. 9B are plan views showing a substantial part of four-row and five-row first frames according to the first embodiment of the present invention.
Figure 9B:
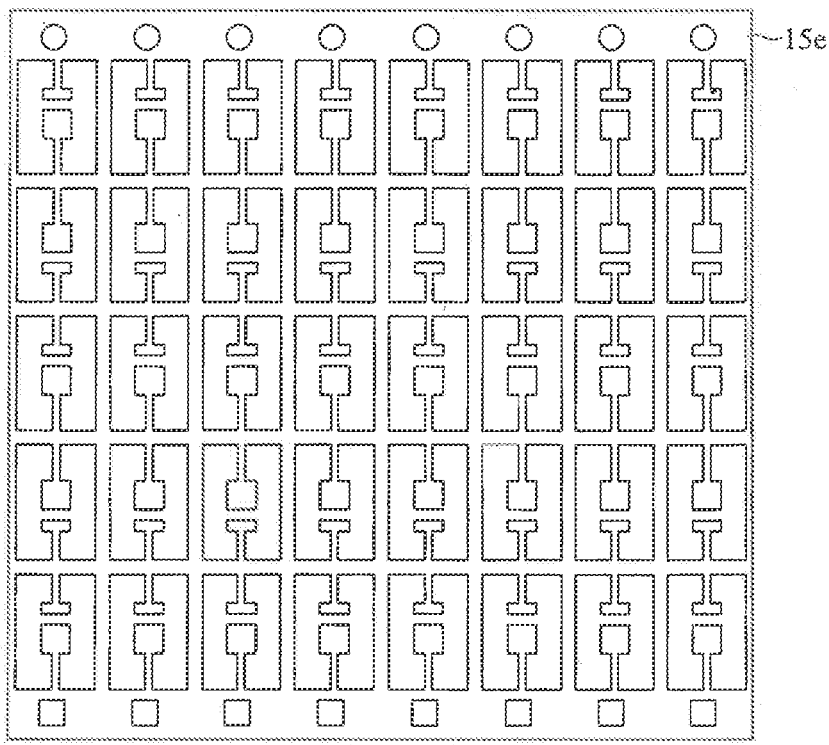

Planar shapes of the first frame mainly used as a single body are shown in FIGS. 8A to 8C and FIGS. 9A and 9B. FIGS. 8A, 8B and 8C are plan views showing substantial parts of a one-row first frame 15a, a two-row first frame 15b, and a three-row first frame 15c, and FIGS. 9A and 9B are plan views showing substantial parts of a four-row first frame 15d and a five-row first frame 15e.

Figure 10A:
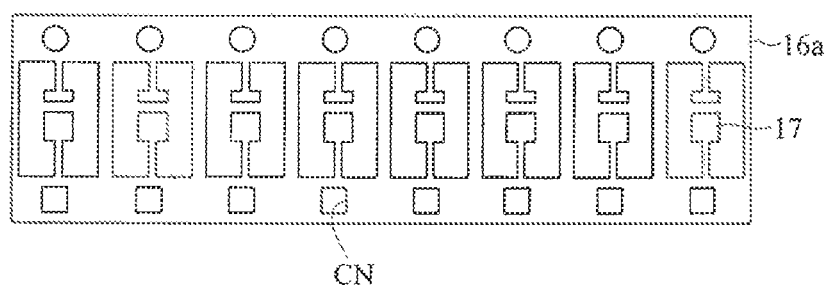
FIG. 10A and FIG. 10B are plan views showing a substantial part of one-row and two-row second frames according to the first embodiment of the present invention.
Figure 10B:
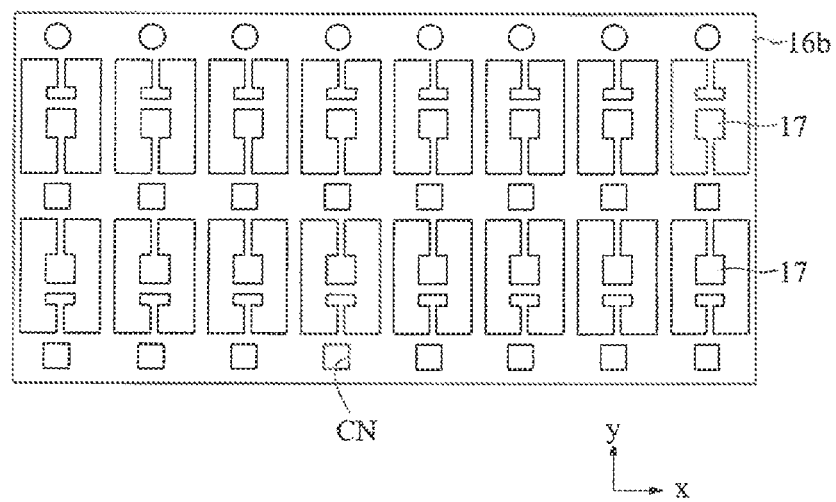
Figure 11A:
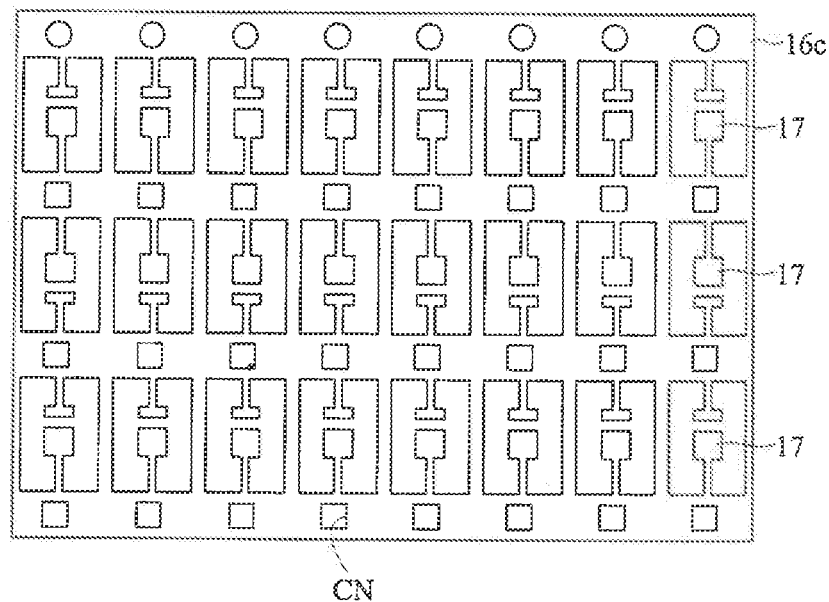
FIG. 11A and FIG. 11B are plan views showing a substantial part of three-row and four-row second frames according to the first embodiment of the present invention.
Figure 11B:
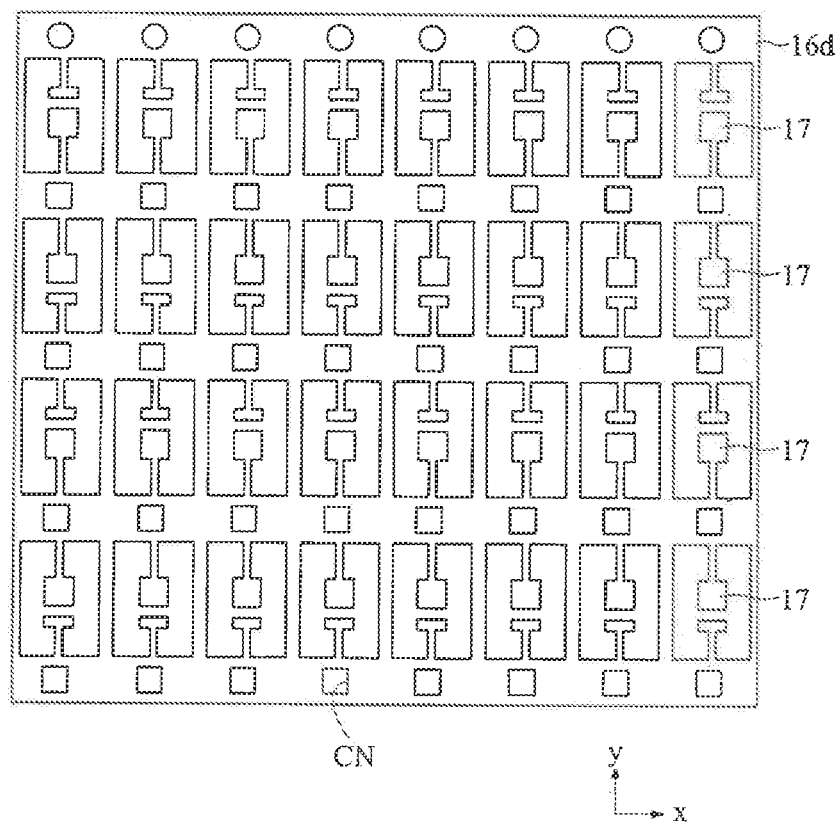

Next, planar shapes of the second frame mainly used as a combination of plural units are shown in FIGS. 10A and 10B and FIGS. 11A and 11B. FIGS. 10A and 10B are plan views showing substantial parts of a one-row second frame 16a and a two-row second frame 16b, and FIGS. 11A and 11B are plan views showing substantial parts of a three-row second frame 16c and a four-row second frame 16d. In the second frames 16a to 16d, pitches in the y direction (the direction vertical to the arrangement direction of the guide holes CN of the second frames 16a to 16d: the second direction) of the die bonding areas 17 are arranged at the same intervals. When a frame having five or more rows is required, any of these one-row to four-row second frames 16a to 16d are selected and assembled to manufacture such a frame. That is, by combining an n-row frame and an m-row frame, (n+m)-row frame can be manufactured.

Figure 12:
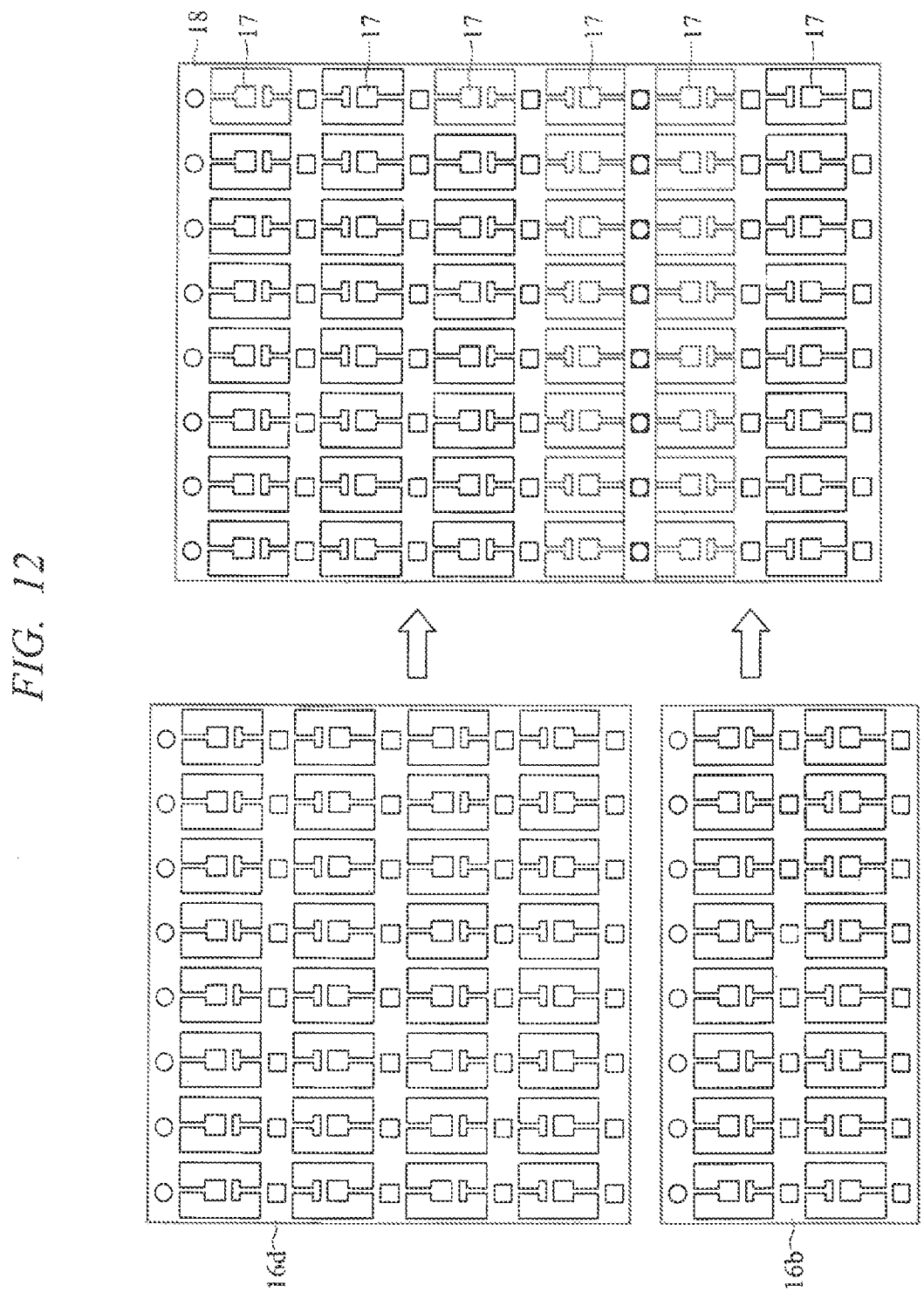
FIG. 12 is a plan view showing a substantial part of a six-row frame according to the first embodiment of the present invention.

FIG. 12 is a plan view showing a substantial part of a six-row frame 18 that is formed by combining the two-row second frame 16b shown in FIG. 10B and the four-row second frame 16d shown in FIG. 11B. Also in this six-row frame 18 formed by the combination, pitches in the y direction of the die bonding areas 17 can be made at the same intervals. For the attachment of the second frame 16b and the second frame 16d, for example, adhesive tape and the like are used. Meanwhile, a six-row frame can be formed by combining three two-row second frames 16b shown in FIG. 10B, or a six-row frame can be formed by combining two three-row second frames 16c shown in FIG. 11A. Further, by combining a plurality of second frames 16a to 16d, a seven-or-more-row frame can be formed, and thus, an LED light source having a relatively large area can be realized.

Figure 13A:
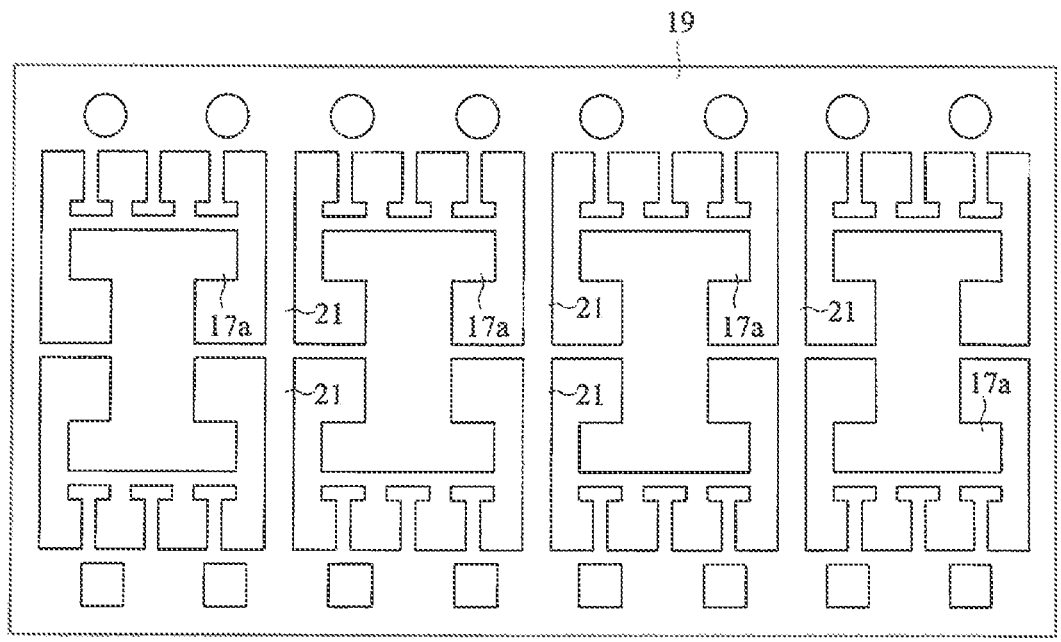
FIG. 13A and FIG. 13B are plan views showing a substantial part of a two-row third frame according to the first embodiment of the present invention.
Figure 13B:
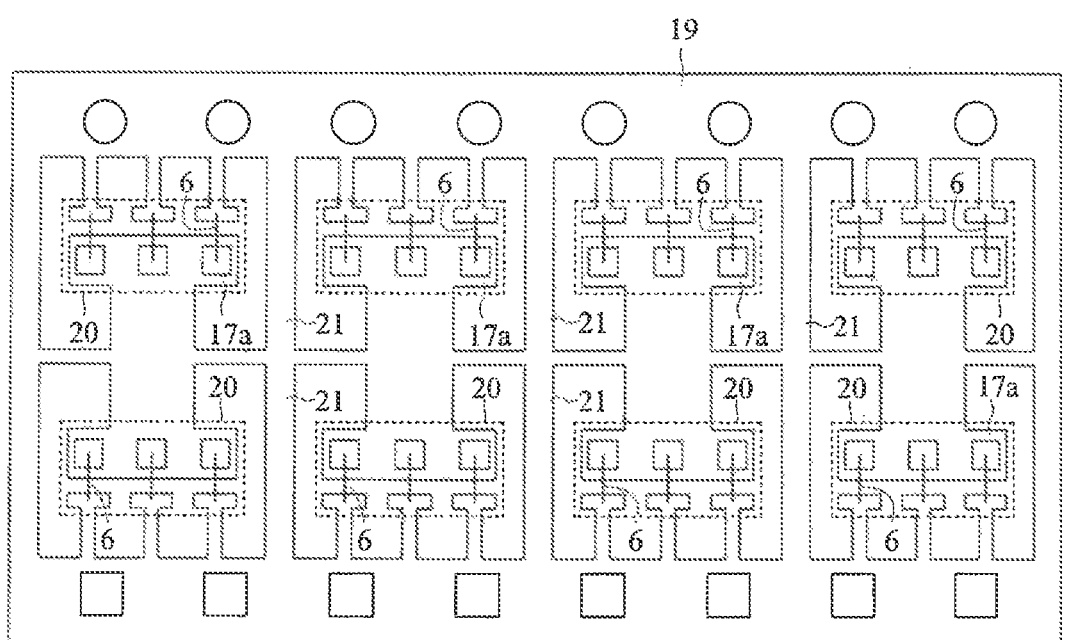

Next, a planar shape of a third frame in which the size of the die bonding area is made relatively large and a plurality of LEDs can be mounted on a single die bonding area is shown in FIG. 13A and FIG. 13B. FIG. 13A is a plan view showing a substantial part of a two-row third frame 19 in which three LEDs can be mounted in a single die bonding area 17a, and FIG. 13B is a plan view showing a substantial part of a third frame 19 in which three LEDs of a red LED, a green LED, and a blue LED are mounted in a single die bonding area 17a. The broken line shown in FIG. 13B indicates resin 20, and three LEDs, a single die bonding area 17a, three bonding wires 6 and three wire bonding areas are sealed by each resin 20. Since the width of the die bonding area 17 can be increased in the third frame 19, it is possible to improve the heat dissipation efficiency in comparison with, for example, the first frame 15b shown in FIG. 8B. Meanwhile, this third frame 19 is used mainly for the RGB three primary color LED light source 1A. Further, in order to improve the white efficiency, a third frame in which four LEDs (for example, one red LED, two green LEDs and one blue LED) are mounted can be used. At this moment, the number of the wire bonding areas opposed to the die bonding areas 17a is set to be equal to the number of LEDs, that is, four.

Figure 14A:
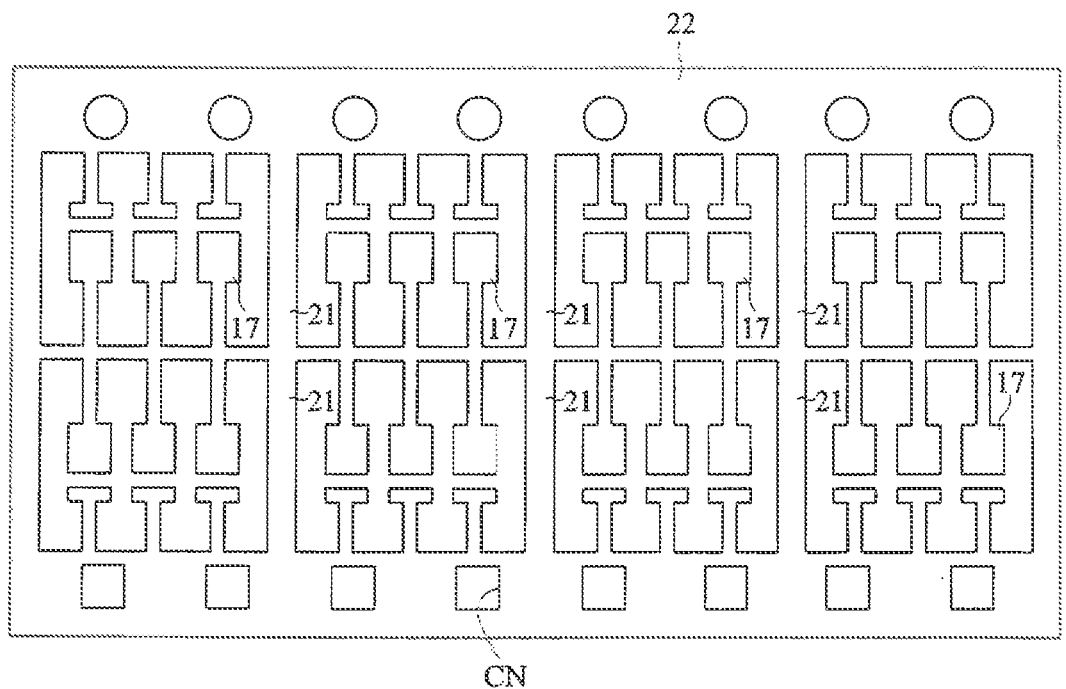
FIG. 14A and FIG. 14B are plan views showing a substantial part of a two-row fourth frame according to the first embodiment of the present invention.
Figure 14B:
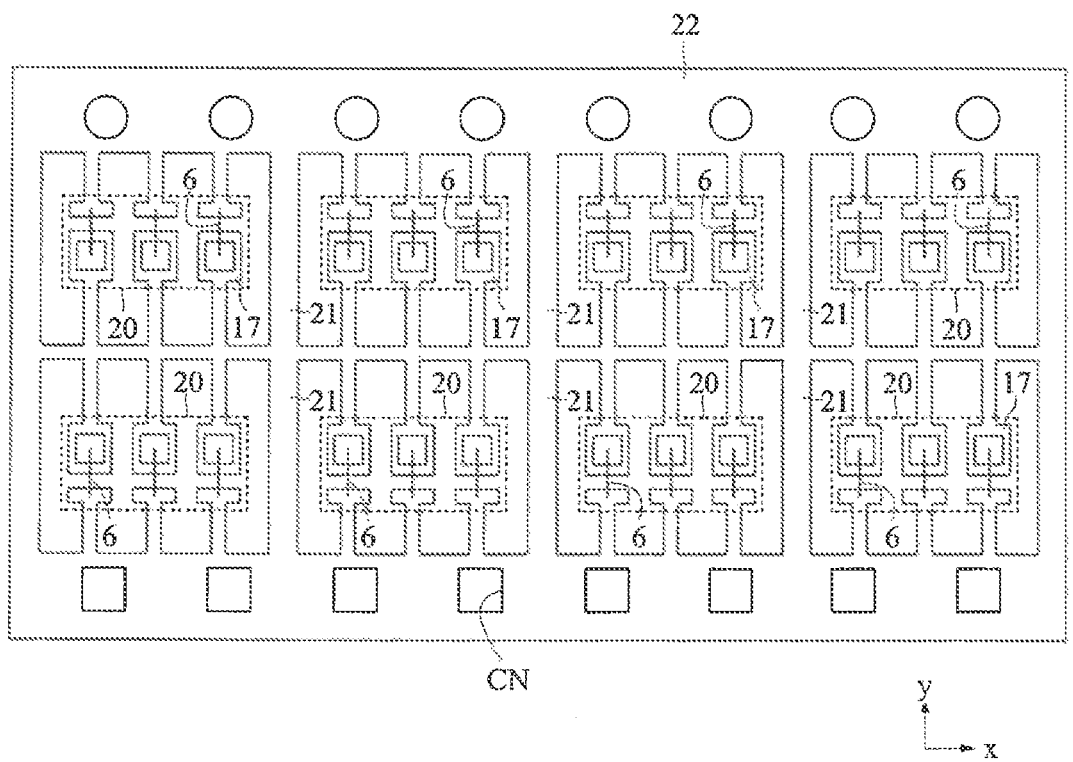

Next, a planar shape of a fourth frame in which one LED is mounted in a single die bonding area, the die bonding areas and the tie bars are not arranged alternately, and the tie bars are arranged so as to interpose plural die bonding areas therebetween is shown in FIG. 14A and FIG. 14B. FIG. 14A is a plan view showing a substantial part of a fourth frame 22 in which three die bonding areas 17 arranged continuously in the x direction (the direction parallel to the arrangement direction of the guide holes CN of the fourth frame 22: first direction) are set as one region, and the tie bars 21 are arranged so as to separate the regions, and FIG. 14B is a plan view showing a substantial part of a fourth frame 22 in which three LEDs of a red LED, a green LED and a blue LED are mounted respectively on the three die bonding areas 17 in the one region. The broken line shown in FIG. 14B indicates resin 20, and three LEDs, three die bonding areas 17, three bonding wires 6 and three wire bonding areas are sealed by each resin 20. Similar to the third frame 19 mentioned above, this fourth frame 22 is used mainly for the RGB three primary color LED light source 1A. Further, in order to improve the white efficiency, a fourth frame in which four LEDs (for example, one red LED, two green LEDs and one blue LED) are mounted in the one region can be used.

(LED Arrangement Pattern)

In the RGB three primary color LED light source 1A, by mounting more number of the green LEDs on the frame than the number of other LEDs such as red LEDs or blue LEDs, the improvement in the white efficiency can be achieved. Hereinafter, various arrangements of the red LEDs, the blue LEDs and the green LEDs to improve the white efficiency in the first embodiment will be illustrated in FIG. 15 to FIG. 18. As the frame, the four-row second frame 16d (FIG. 11B above) in which the die bonding areas 17 are arranged at the same intervals in the y direction is used.

Figure 15:
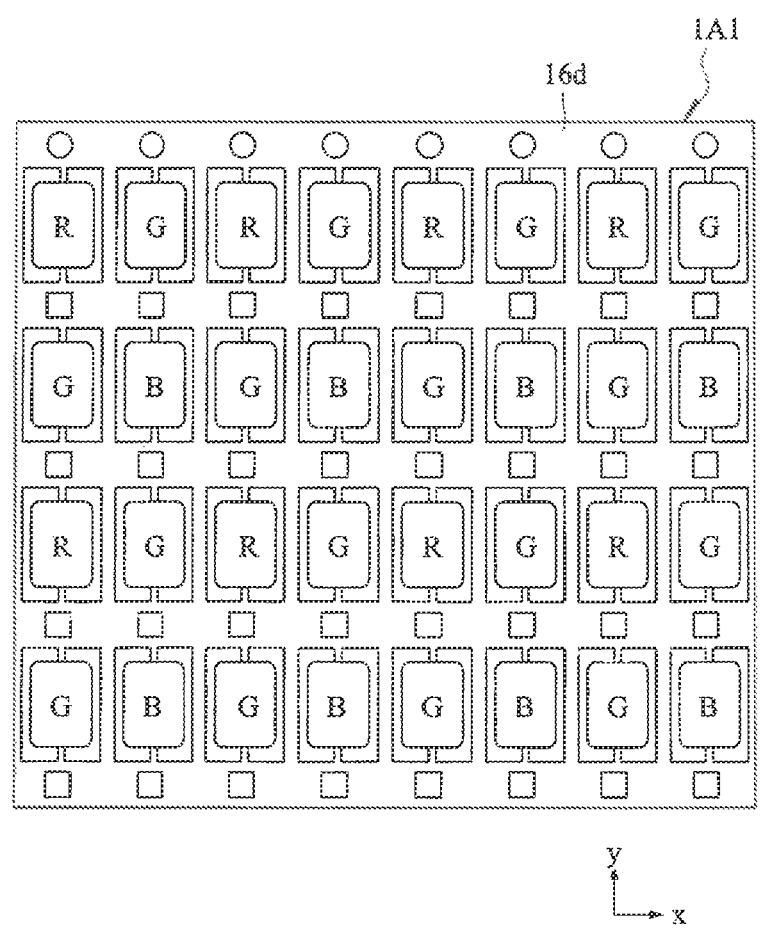
FIG. 15 is a plan view showing a substantial part of an LED light source in which a first arrangement example of red LEDs, green LEDs, and blue LEDs is illustrated according to the first embodiment of the present invention.
Figure 16:
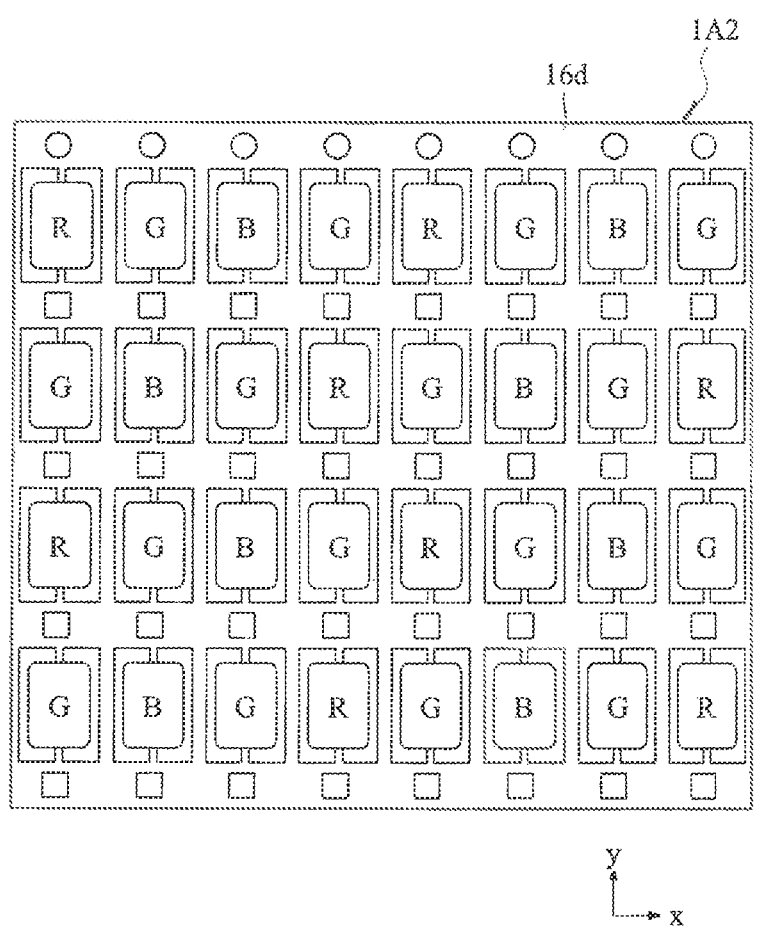
FIG. 16 is a plan view showing a substantial part of an LED light source in which a second arrangement example of red LEDs, green LEDs, and blue LEDs is illustrated according to the first embodiment of the present invention.
Figure 17:
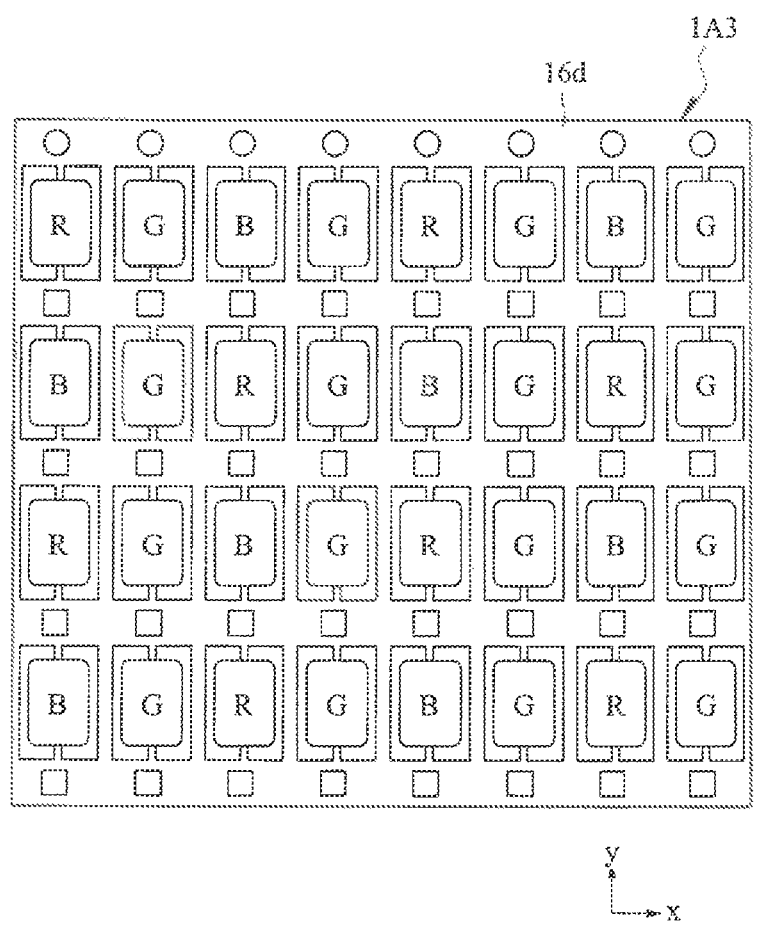
FIG. 17 is a plan view showing a substantial part of an LED light source in which a third arrangement example of red LEDs, green LEDs, and blue LEDs is illustrated according to the first embodiment of the present invention.
Figure 18:
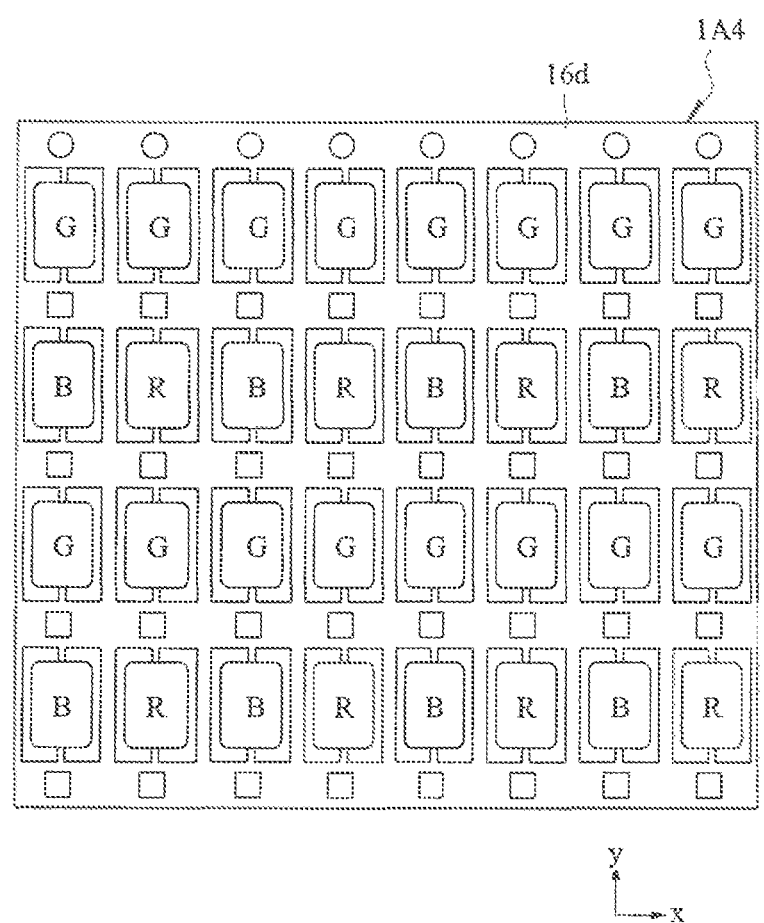
FIG. 18 is a plan view showing a substantial part of an LED light source in which a fourth arrangement example of red LEDs, green LEDs, and blue LEDs is illustrated according to the first embodiment of the present invention.

FIG. 15 is a plan view showing a substantial part of an RGB three primary color LED light source 1A1 in which the red LED (R) and the green LED (G) are arranged alternately in the odd number rows in the x direction and the green LED (G) and the blue LED (B) are arranged alternately in the even number rows in the x direction, and FIG. 16 is a plan view showing a substantial part of an RGB three primary color LED light source 1A2 in which the red LED (R), the green LED (G), the blue LED (B) and the green LED (G) are arranged repeatedly in the x direction and the green LEDs (G) are arranged in a zigzag pattern in the y direction. Also, FIG. 17 is a plan view showing a substantial part of an RGB three primary color LED light source 1A3 in which the red LED (R), the green LED (G), the blue LED (B) and the green LED (G) are arranged repeatedly in the x direction and the green LEDs (G) are arranged in even number rows in the y direction, and FIG. 18 is a plan view showing a substantial part of an RGB three primary color LED light source 1A4 in which the green LEDs (G) are arranged in the odd number rows in the x direction and the red LED (R) and the blue LED (B) are arranged alternately in the even number rows in the x direction. In any of the arrangements of FIG. 15 to FIG. 18, the ratio in the number of the red LEDs (R), the green LEDs (G), and the blue LEDs (B) is 1:2:1. Further, in the first embodiment, the arrangement is not limited to these arrangements, but LEDs arranged in even number rows may be arranged in odd number rows, and LEDs arranged in odd number rows may be arranged in even number rows.

(Pairing)

If the light emitting efficiency of LEDs is uneven, the brightness varies, and the problem of the color unevenness and the contrast unevenness appearing in the LED light sources occurs. Therefore, in the first embodiment, in the manufacturing process called the front-end process or the diffusion process, after a plurality of LED chips are formed on a semiconductor wafer, the electrical and optical characteristics of the respective LED chips are measured, and the characteristic data are stored in a recording media such as a floppy disk (registered trademark) or stored in a database via a network, and thereafter, on the basis of the characteristic data, LED chips having the same or similar characteristics are automatically selected, and these LED chips are adhered onto the frame. In this manner, since LEDs with little difference in the light emitting efficiency can be mounted on the frame, it is possible to obtain the LED light sources without the color unevenness and contrast unevenness.

(Repair)

Even if an LED mounted on the frame is broken, the LED light source can be easily repaired. Herein, a method of exchanging one faulty LED with a supplementary LED will be described. FIG. 19A to FIG. 19D are plan views showing a substantial part of the RGB three primary color LED light source 1A for describing a repair method. The RGB three primary color LED light source 1A is formed in a two-row frame 3.

Figure 19A:
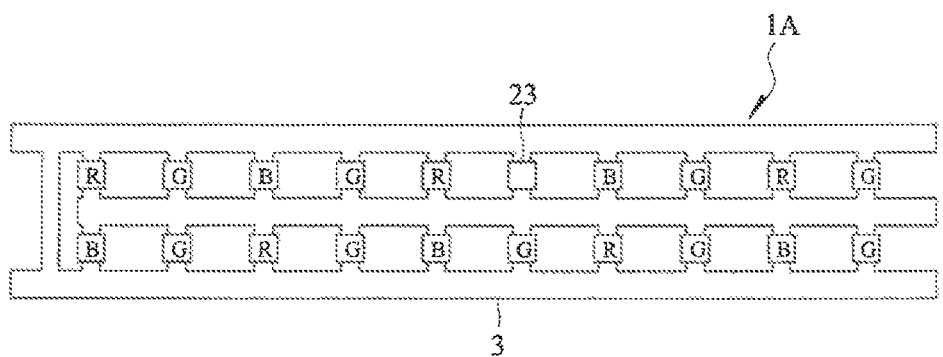
FIG. 19A to FIG. 19D are plan views showing a substantial part of an LED light source for describing a repair method according to the first embodiment of the present invention.
Figure 19B:
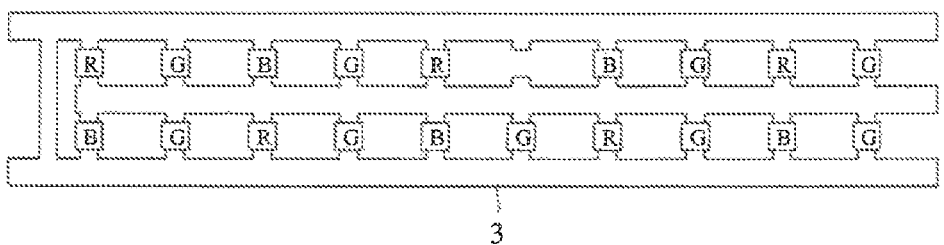
Figure 19C:
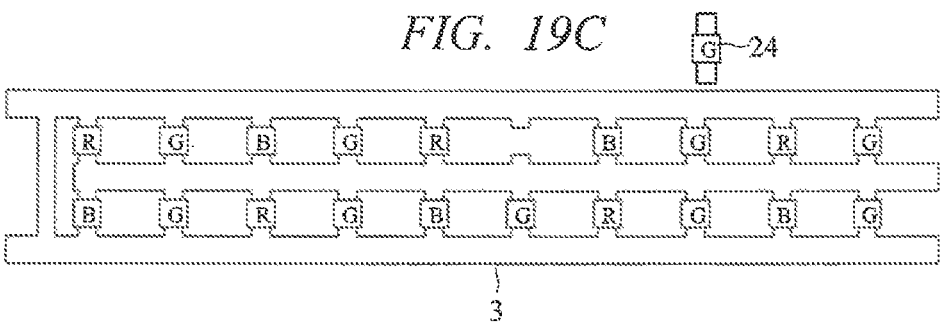
Figure 19D:
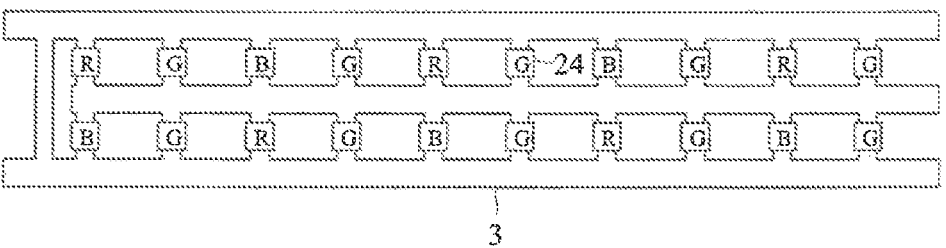

First, as shown in FIG. 19A, a faulty LED 23 is confirmed by a lighting test, and then as shown in FIG. 19B, the faulty LED 23 is punched out from the frame 3. As shown in FIG. 19C, a plurality of supplementary LEDs 24 are manufactured in advance, and a supplementary LED 24 that has the same or the similar characteristics to those of the red LEDs, the blue LEDs and the green LEDs that have been mounted on the frame 3 is selected from the plurality of supplementary LEDs 24. Thereafter, as shown in FIG. 19D, the supplementary LED 24 is adhered to the portion of the frame 3 where the faulty LED 23 has been punched out. For the adhesion of the supplementary LED 24, for example, solder paste can be used.

(Assembling Apparatus of LED Light Source)

Figure 20:
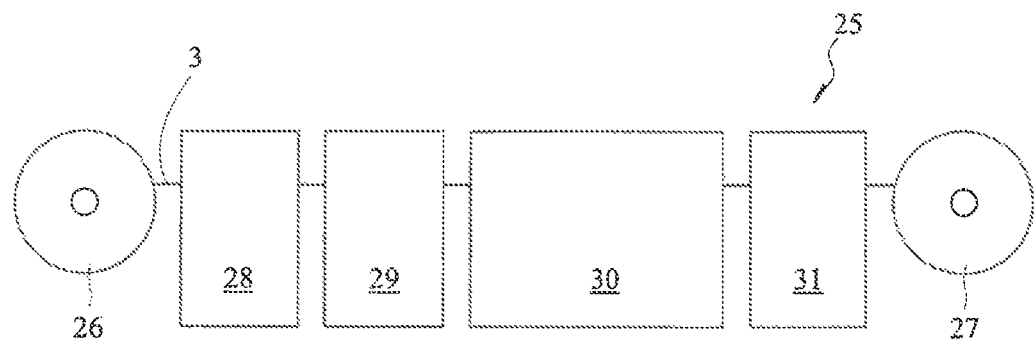
FIG. 20 is a schematic diagram showing an LED light source assembling apparatus using a reel-to-reel method according to the first embodiment of the present invention.

A method of assembling an LED light source using a reel-to-reel method will be described. FIG. 20 is a schematic diagram showing an LED light source assembling apparatus 25 using a reel-to-reel method. While the frame 3 wound around a reel 26 is being wound around the other reel 27, a die bonding process 28 (process P2 in FIG. 3), a wire bonding process 29 (process P3 in FIG. 3), a mold process (process P4 in FIG. 3), and a tie bar cut process 31 (process P5 in FIG. 3) are carried out sequentially, thereby continuously mounting the LEDs on the frame 3. By this means, it is possible to continuously manufacture band-shaped LED light sources with the length enough to be wound around the reels 26 and 27. Thereafter, the band shaped LED light sources can be cut into arbitrary length, and accordingly, it is possible to manufacture LED light sources with general versatility.

Meanwhile, it is also possible to manufacture the LED light sources by another manufacturing method in which the reel-to-reel method is not used, but die bonder, wire bonder and molding apparatus are used in the respective processes. However, in this manufacturing method, since the frame size is determined by the size of a magazine (container to supply and contain the frames) provided in each manufacturing apparatus, the length of the frames is restricted.

Second Embodiment

Figure 21A:
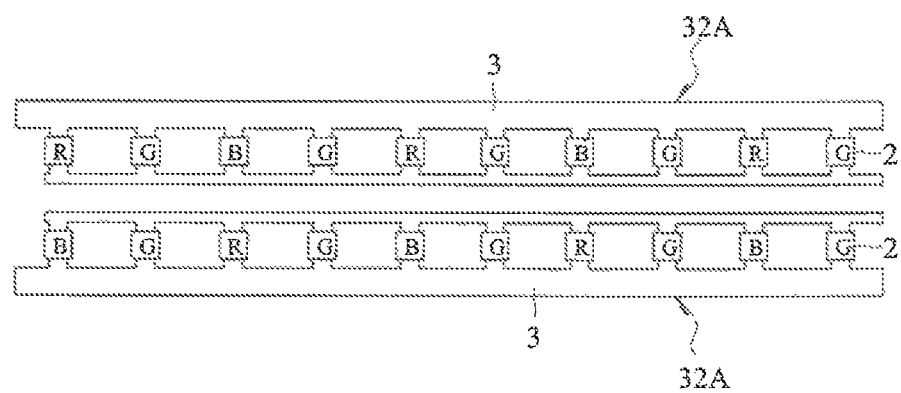
FIG. 21A and FIG. 21B are plan views showing a substantial part of an LED light source according to a second embodiment of the present invention.
Figure 21B:
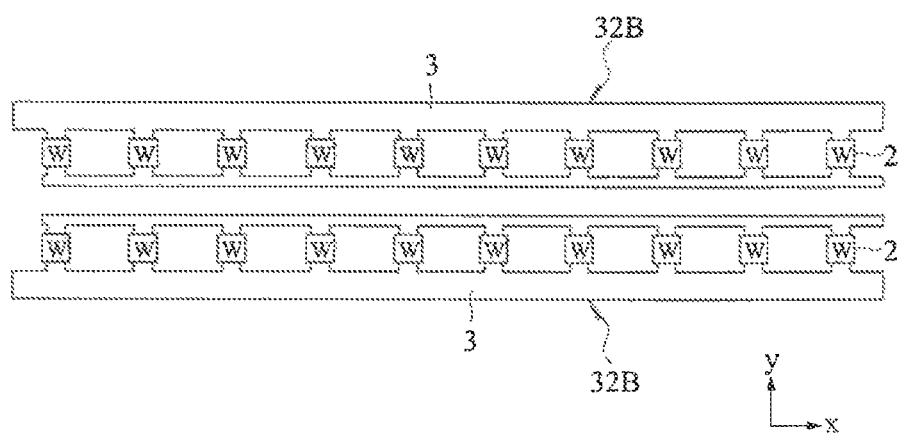

An LED light source according to a second embodiment will be described with reference to FIG. 21A and FIG. 21B. FIG. 21A is a plan view showing a substantial part of an RGB three primary color LED light source 32A using red LEDs (R), green LEDs (G) and blue LEDs (B), and FIG. 21B is a plan view showing a substantial part of a white LED light source 32B using white LEDs (W) composed of the blue LED chips covered with phosphors. In the second embodiment, the RGB three primary color LED light source 1A or the white LED light source 1B formed in the two-row frame 3 shown in FIG. 1 and FIG. 2 according to the first embodiment is split in the x direction by the use of, for example, a separating apparatus, thereby manufacturing two one-row RGB three primary color LED light sources 32A or two one-row white LED light sources 32B. In the manufacturing method in which LEDs 2 are mounted on the two-row frame 3 and then the frame is split into the one-row RGB three primary color LED light sources 32A or the one-row white LED light sources 32B as described above, the manufacturing time can be shortened in comparison with the method in which LEDs are mounted on the one-row frame 3 to manufacture one-row LED light sources. Further, by splitting the frame 3, the intervals or the brightness of the RGB three primary color LED light sources 32A or the one-row white LED light sources 32B can be easily adjusted.

Meanwhile, although the number of rows of the frame 3 is two rows in the second embodiment, it may be three rows or more. For example, in the case where a three-row frame is used, the frame can be divided into three one-row LED light sources or a one-row LED light source and a two-row LED light source.

Third Embodiment

Figure 23A:
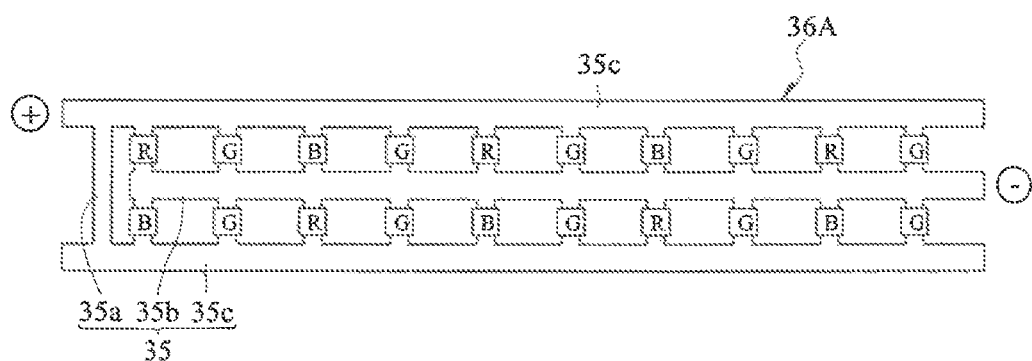
FIG. 23A and FIG. 23B are plan views showing a substantial part of an LED light source provided with a two-row frame indicating the voltage to be applied according to the third embodiment of the present invention.
Figure 23B:
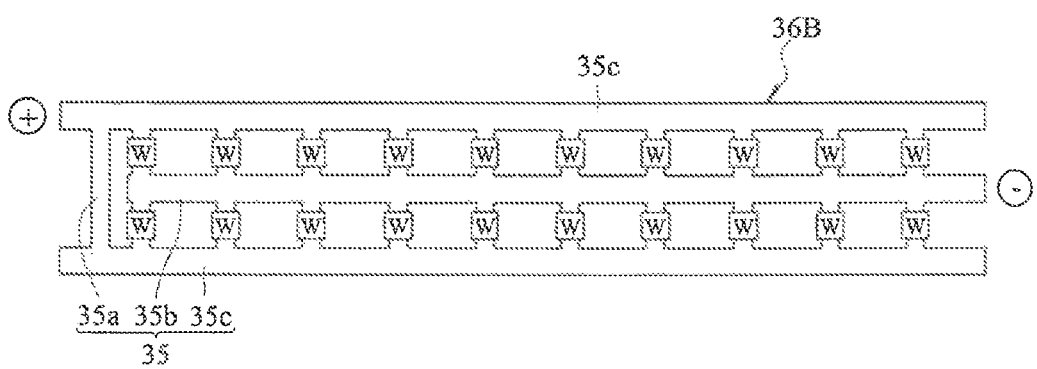
Figure 24A:
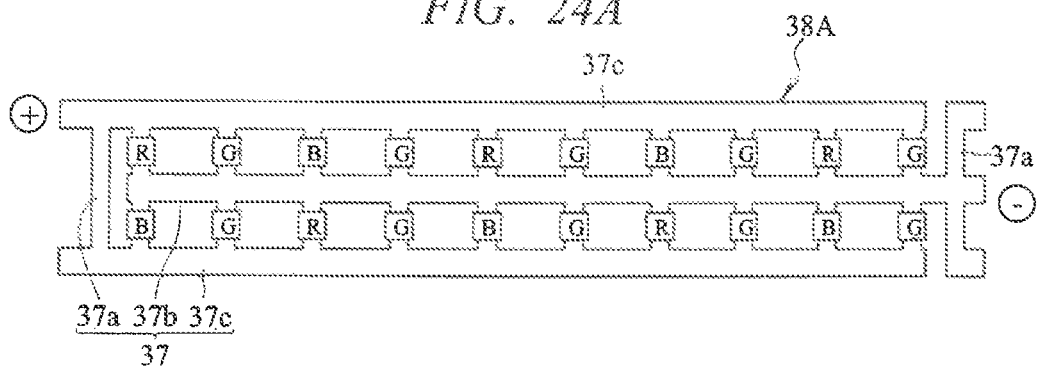
FIG. 24A and FIG. 24B are plan views showing a substantial part of an LED light source provided with a two-row frame indicating the voltage to be applied according to the third embodiment of the present invention.
Figure 24B:
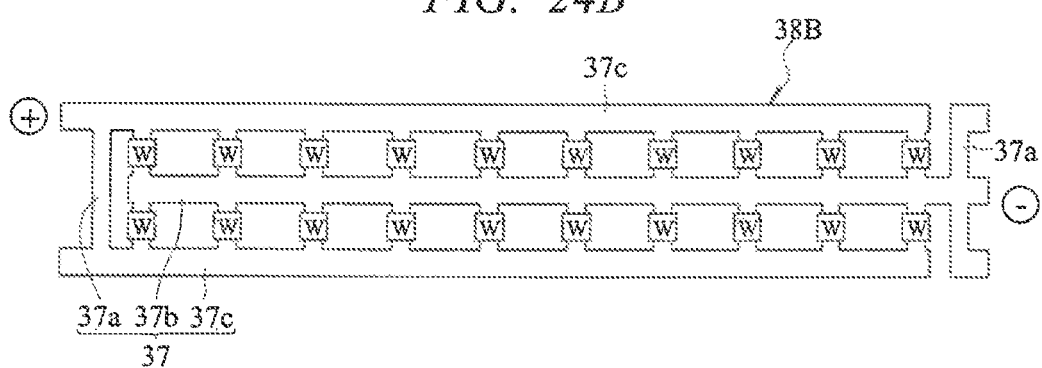
Figure 25:
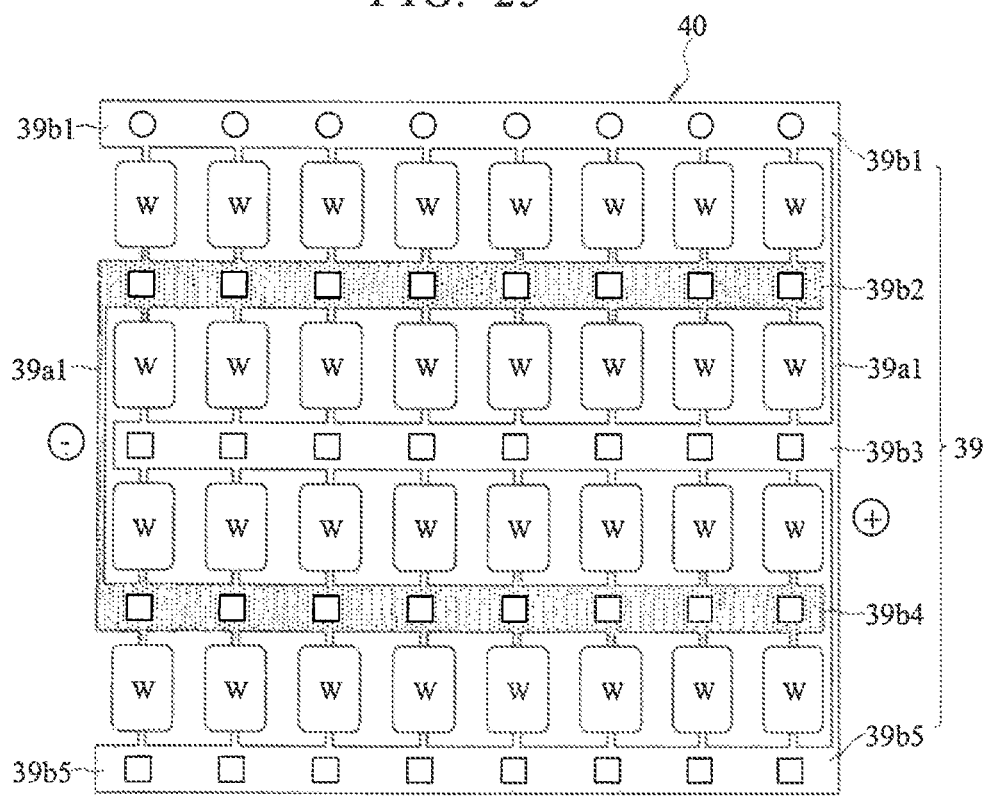
FIG. 25 is a plan view showing a substantial part of an LED light source provided with a four-row frame indicating the voltage to be applied according to the third embodiment of the present invention.

One example of the power source connection method to LED light sources according to a third embodiment is shown in FIG. 22 to FIG. 25. FIG. 22A and FIG. 22B are plan views showing a substantial part of an RGB three primary color LED light source 34A and a white LED light source 34B which are respectively formed on a two-row frame 33 and to which voltage is applied from an end of the frame 33. FIG. 23A and FIG. 23B are plan views showing a first example of an RGB three primary color LED light source 36A and a white LED light source 36B which are respectively formed on a two-row frame 35 and to which voltage is applied from both ends of the frame 35. FIG. 24A and FIG. 24B are plan views showing a second example of an RGB three primary color LED light source 38A and a white LED light source 38B which are respectively formed on a two-row frame 37 and to which voltage is applied from both ends of the frame 37. FIG. 25 is a plan view showing a substantial part of a white LED light source 40 which is formed on a four-row frame 39 and to which voltage is applied from both ends of the frame 39.

Figure 22A:
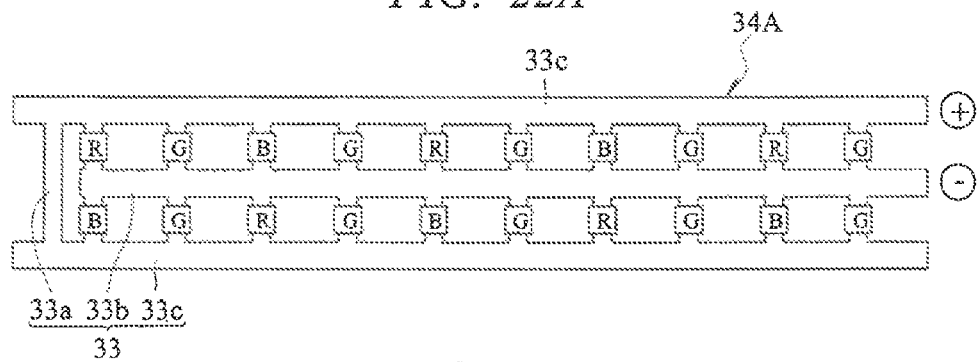
FIG. 22A and FIG. 22B are plan views showing a substantial part of an LED light source provided with a two-row frame indicating the voltage to be applied according to a third embodiment of the present invention.
Figure 22B:
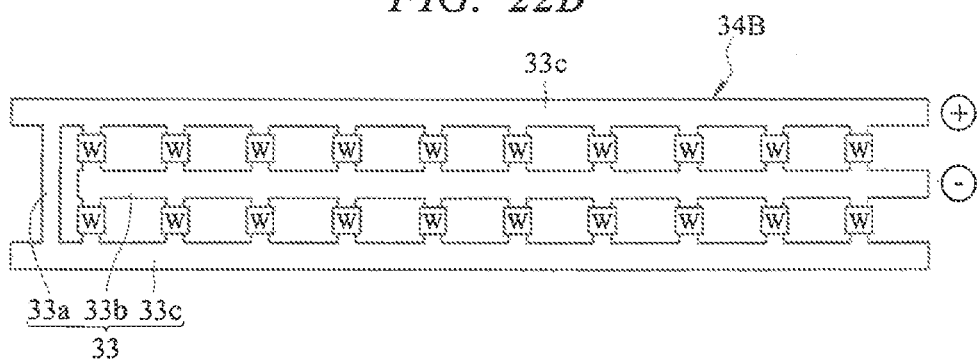

In the RGB three primary color LED light source 34A and the white LED light source 34B shown in FIG. 22A and FIG. 22B respectively, only a tie bar 33a at one end of the frame 33 is left, other tie bars are all cut off, and the left tie bar 33a is also separated from an inner lead 33b. By this means, two outer leads 33c are connected by the tie bar 33a. Accordingly, by connecting a power source to be connected to the RGB three primary color LED light source 34A or the white LED light source 34B to one end of the frame 33, a first polarity voltage (positive or negative voltage) can be applied to the two outer leads 33c to which one ends of the red LEDs (R), the green LEDs (G) and the blue LEDs (B) or one ends of the white LEDs (W) are connected, and a second polarity voltage (negative or positive voltage) opposite to the first polarity can be applied to the one inner lead 33b to which the other ends of the red LEDs (R), the green LEDs (G) and the blue LEDs (B) or the other ends of the white LEDs (W) are connected.

The RGB three primary color LED light source 36A and the white LED light source 36B respectively shown in FIG. 23A and FIG. 23B are manufactured in the same manner as the RGB three primary color LED light source 34A and the white LED light source 34B mentioned above, and two outer leads 35b are connected by the tie bar 35a left at one end of the frame 35. Accordingly, by connecting a power source to be connected to the RGB three primary color LED light source 36A or the white LED light source 36B to both ends of the frame 35, a first polarity voltage (positive or negative voltage) can be applied to the two outer leads 35c to which one ends of the red LEDs (R), the green LEDs (G) and the blue LEDs (B) or one ends of the white LEDs (W) are connected, and a second polarity voltage (negative or positive voltage) can be applied to the one inner lead 35b to which the other ends of the red LEDs (R), the green LEDs (G) and the blue LEDs (B) or the other ends of the white LEDs (W) are connected.

In the RGB three primary color LED light source 38A and the white LED light source 38B respectively shown in FIG. 24A and FIG. 24B, tie bars 37a1 and 37a2 at both the ends of the frame 37 are left and other tie bars are all cut off, and the tie bar 37a1 left at one end of the frame 37 is separated from one inner lead 37b and the tie bar 37a2 left at the other end of the frame 37 is separated from two outer leads 37c. By this means, the two outer leads 37c are connected by the tie bar 37a1, and one inner lead 37b is held by the tie bar 37a2. Accordingly, by connecting a power source to be connected to the RGB three primary color LED light source 38A or the white LED light source 38B to both ends of the frame 37, a first polarity voltage (positive or negative voltage) can be applied to the two outer leads 37c to which one ends of the red LEDs (R), the green LEDs (G) and the blue LEDs (B) or one ends of the white LEDs (W) are connected, and a second polarity voltage (negative or positive voltage) can be applied to the one inner lead 37b to which the other ends of the red LEDs (R), the green LEDs (G) and the blue LEDs (B) or the other ends of the white LEDs (W) are connected.

As shown in FIG. 25, in a white LED light source 40, a partial tie bar 39a1 at one end of a frame 39 is left to connect second row and fourth row leads 39b2 and 39b4 and a partial tie bar 39a2 at the other end of the frame 39 is left to connect first row, third row and fifth row leads 39b1, 39b3 and 39b5, and other tie bars are all cut off. Further, the tie bar 39a1 is separated from the third row lead 39b3, and the tie bar 39a2 is separated from the second row and fourth row leads 39b2 and 39b4. By this means, the second row lead 39b2 and the fourth row lead 39b4 are connected by the tie bar 39a1, and the first row lead 39b1, the third row lead 39b3, and the fifth row lead 39b5 are connected by the tie bar 39a2. Accordingly, by connecting a power source to be connected to the white LED light source 40 to both the ends of the frame 39, a first polarity voltage (positive or negative voltage) can be applied to the second row lead 39b2 and the fourth row lead 39b4 to which one ends of the white LEDs (W) are connected, and a second polarity voltage (negative or positive voltage) can be applied to the first row lead 39b1, the third row lead 39b3, and the fifth row lead 39b5 to which the other ends of the white LEDs (W) are connected.

Next, three methods of connecting a power source to the LED light source according to a third embodiment will be described with reference to a schematic diagram shown in FIG. 26. Although the method of connecting a power source to one end of the frame will be described here, the method of connecting a power source to both the ends of the frame can be performed in the same manner.

Figure 26A:
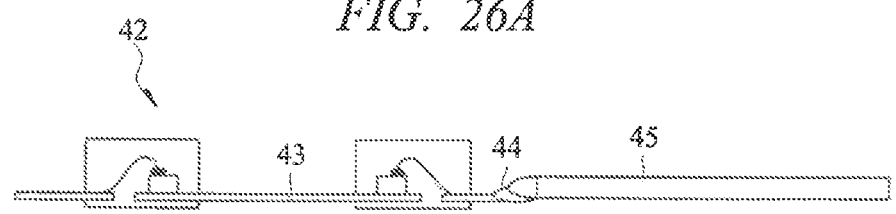
FIG. 26A to FIG. 26C are schematic diagram showing a connection method of an LED light source and a power source according to the third embodiment of the present invention.
Figure 26B:
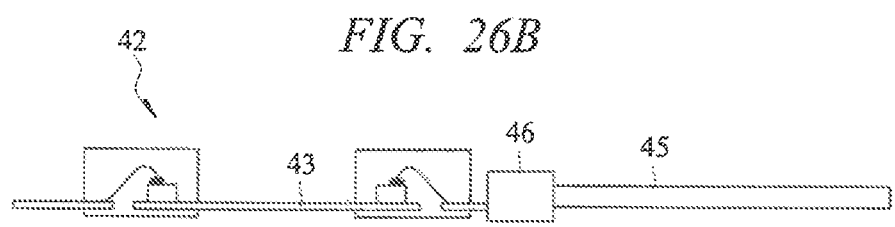
Figure 26C:
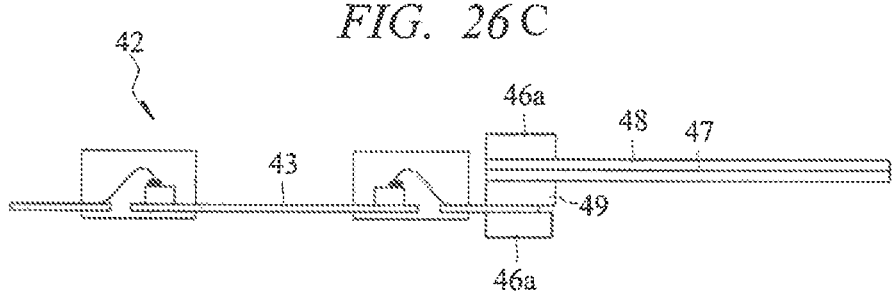

In the first connection method, as shown in FIG. 26A, a lead wire 45 is connected to one end of a frame 43 constituting an LED light source 42 by the use of solder paste 44. In the second connection method, as shown in FIG. 26B, a lead wire 45 is connected to one end of a frame 43 constituting an LED light source 42 by the use of a connector 46. In the third connection method, as shown in FIG. 26C, a flexible substrate 48 on which a wiring pattern 47 is formed is fixed to one end of a frame 43 constituting an LED light source 42 by the use of a connector 46a. Between the wiring pattern 47 and the frame 43, an anisotropic conductive film 49 is inserted, and when voltage is applied thereto, current flows through the anisotropic conductive film 49 and the wiring pattern 47 and the frame 43 are electrically conducted with each other.

Fourth Embodiment

Figure 27:
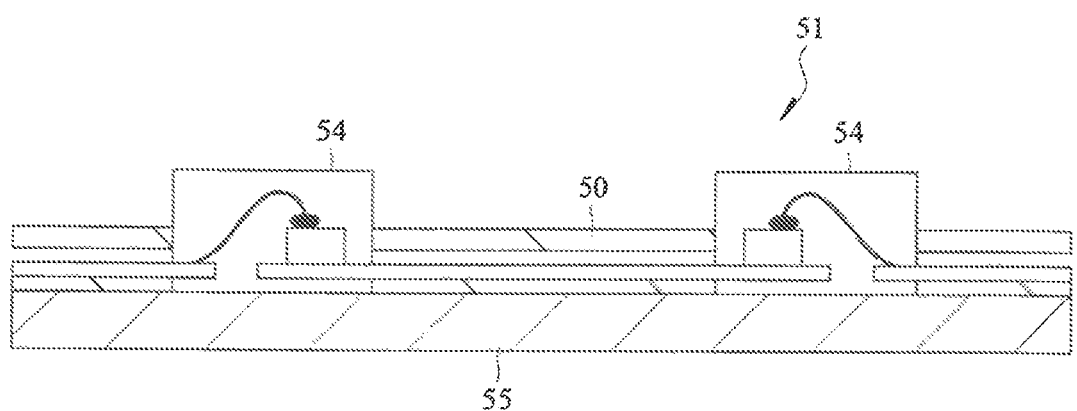
FIG. 27 is a cross sectional view showing a substantial part of an LED light source using a flat-type reflection plate according to a fourth embodiment of the present invention.
Figure 28:
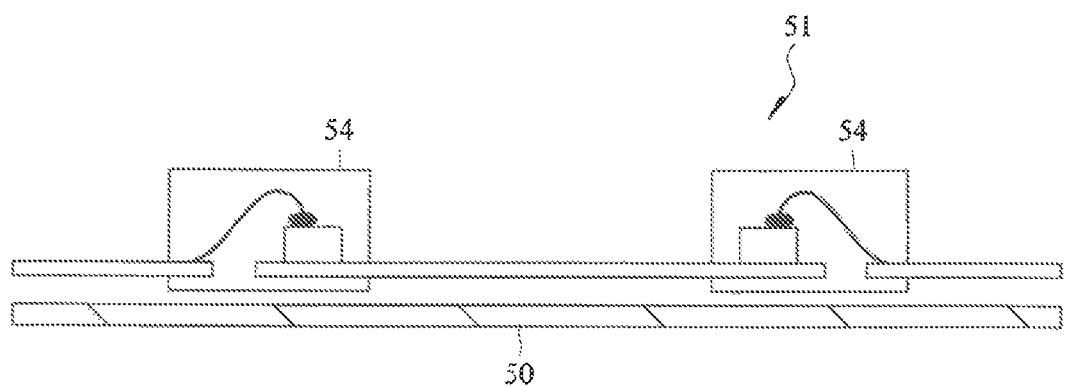
FIG. 28 is a cross sectional view showing a substantial part of an LED light source using a flat-type reflection plate according to the fourth embodiment of the present invention.
Figure 29:
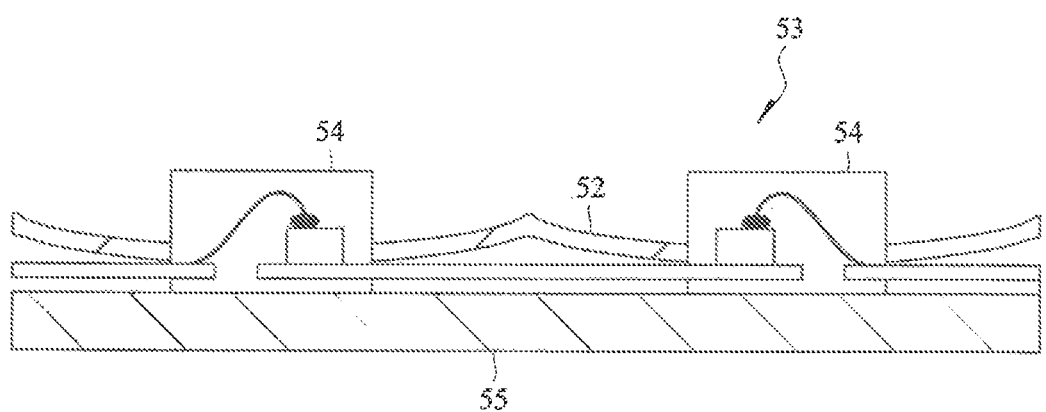
FIG. 29 is a cross sectional view showing a substantial part of an LED light source using a concave-type reflection plate according to the fourth embodiment of the present invention.
Figure 30:
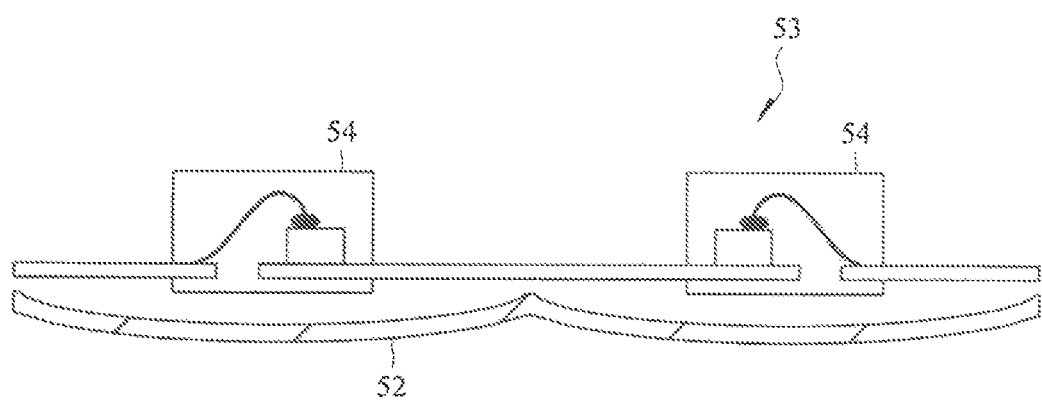
FIG. 30 is a cross sectional view showing a substantial part of an LED light source using a concave-type reflection plate according to the fourth embodiment of the present invention.

One example of the method of arranging a reflection plate according to a fourth embodiment is shown in FIG. 27 to FIG. 30. FIG. 27 and FIG. 28 are cross sectional views each showing a substantial part of an LED light source 51 using a flat-type reflection plate 50, and FIG. 29 and FIG. 30 are cross sectional views each showing a substantial part of an LED light source 53 using a concave-type reflection plate 52. The reflection plates 50 and 52 are, for example, sheets (films or plates), and the thickness thereof is, for example, about 0.5 mm.

As shown in FIG. 27, the flat-type reflection plate 50 is fit between the adjacent LEDs 54 on the illumination surface side of an LED light source 51. In this case, on the rear surface of the LED light source 51, a board 55 that can dissipate heat generating from the LED light source 51 can be arranged. The board 55 is, for example, an aluminum (Al) plate. Further, as shown in FIG. 28, the flat-type reflection plate 50 may be arranged on the rear surface of the LED light source 51.

As shown in FIG. 29, the concave-type reflection plate 52 is fit between the adjacent LEDs 54 on the illumination surface side of an LED light source 53. Owing to the concave shape thereof, the light condensing efficiency can be improved. On the rear surface of the LED light source 53, a board 55 that can dissipate heat generating from the LED light source 53 can be arranged. Further, as shown in FIG. 30, the concave-type reflection plate 52 may be arranged on the rear surface of the LED light source 53.

Meanwhile, in the fourth embodiment, a single-element LED light source in which a single LED chip is adhered onto a single die bonding area and the single LED chip is sealed with resin (for example, the LED light source using the first frames 15a to 15e or the second frames 16a to 16d in the first embodiment) has been illustrated as an example. However, the present invention can be applied also to a plural-element LED light source in which plural LED chips are adhered onto a single die bonding area and the plural LED chips are sealed with resin or a single LED chip is adhered onto a single die bonding area and plural LED chips are collectively sealed with resin (for example, the LED light source using the third frame 19 or the fourth frame 22 in the first embodiment).

Figure 31A:
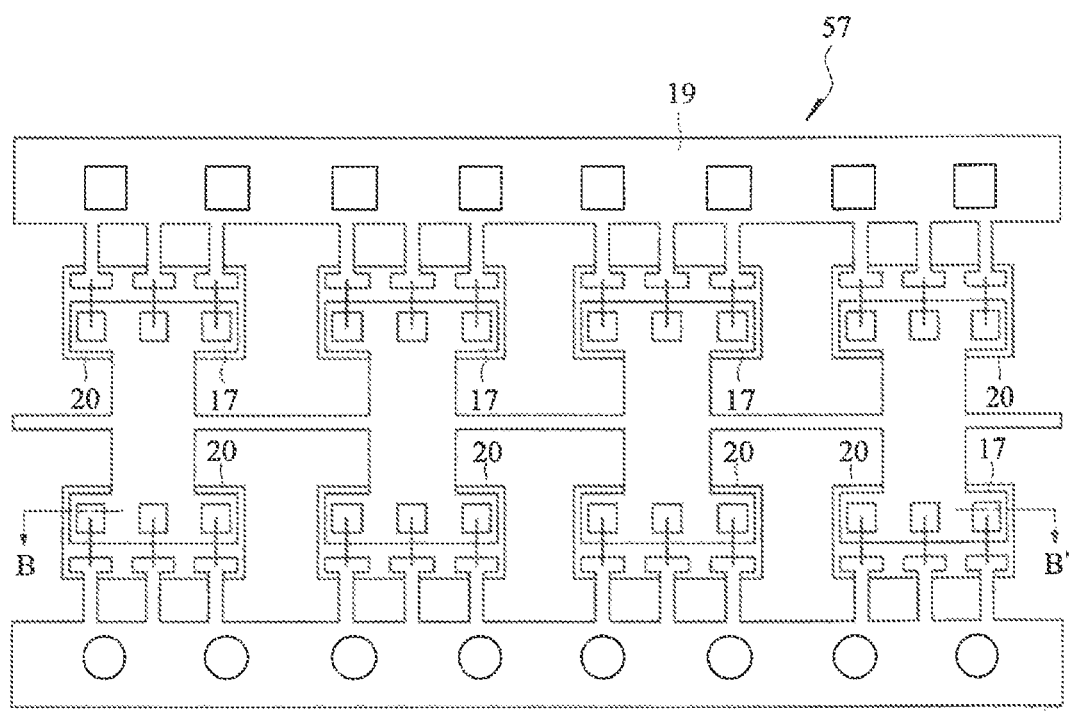
FIG. 31A and FIG. 31B are a plan view and a cross sectional view showing a substantial part of an LED light source using a concave-type reflection plate according to the fourth embodiment of the present invention.
Figure 31B:
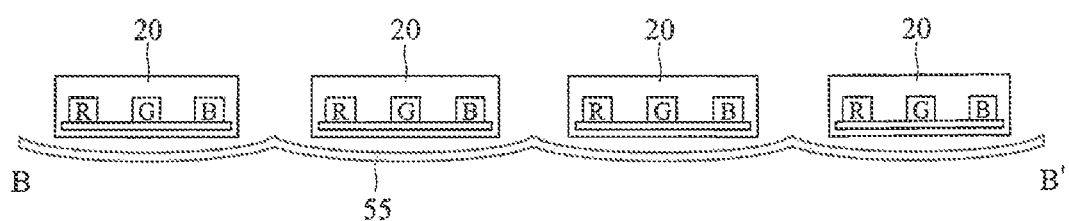

One example of an RGB three primary color LED light source 57 in which red LEDs (R), green LEDs (G), and blue LEDs (B) are mounted on the third frame 19 of the first embodiment and the concave-type reflection plate 52 is arranged on the rear surface of the third frame 19 is shown in FIG. 31A and FIG. 31B. FIG. 31A is a plan view showing a substantial part of the RGB three primary color LED light source 57, and FIG. 31B is a cross sectional view showing a substantial part thereof taken along the line B-B' in FIG. 31A.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments described above, the RGB three primary colors LED light source using red LEDs (R), green LEDs (G), and blue LEDs (B) and the white LED light source using blue LEDs covered with phosphors have been described. However, the present invention can be applied also to an LED light source using other light emitting method, for example, to an LED light source using a method in which phosphors emitting red, green, and blue color lights are excited by bluish-purple LED chips.

INDUSTRIAL APPLICABILITY

The LED light source according to the present invention can be used widely in a cellular phone, an in-vehicle equipment, traffic signals, a lighting device or an office automation equipment, and can be replaced with the light sources that have been used conventionally. Furthermore, the LED light source can be applied as a light emitting element for new industrial fields.

The invention claimed is:

1. A LED light source comprising:
a first electrode having a first side and a second side opposite to the first side;
a second and a fourth electrode arrayed along the first side of the first electrode;
a third and a fifth electrode arrayed along the along the second side of the first electrode;
a first LED chip having a first electrode surface and a second electrode surface opposite to the first electrode surface;
a second LED chip having a third electrode surface and a fourth electrode surface opposite to the third electrode surface;
a third LED chip having a fifth electrode surface and a sixth electrode surface opposite to the fifth electrode surface; and
a fourth LED chip having a seventh electrode surface and a eighth electrode surface opposite to the seventh electrode surface,
wherein the first LED chip and the third LED chip are arrayed along the first side of the first electrode,
wherein the second LED chip and the fourth LED chip are arrayed along the second side of the first electrode,
wherein the first electrode surface of the first LED chip, the third electrode surface of the second LED chip, the fifth electrode surface of the third LED chip, and the seventh electrode surface of the fourth LED chip are electrically connected to the first electrode,
wherein the second electrode surface of the first LED chip is electrically connected to the second electrode,
wherein the fourth electrode surface of the second LED chip is electrically connected to the third electrode,
wherein the sixth electrode surface of the third LED chip is electrically connected to the fourth electrode,
wherein the eighth electrode surface of the fourth LED chip is electrically connected to the fifth electrode,
wherein the first electrode, the second electrode, the third electrode, the first LED chip, and the second LED chip are aligned in a first direction,
wherein the first electrode, the fourth electrode, the fifth electrode, the third LED chip, and the fourth LED chip are aligned in the first direction,
wherein the first LED chip is sealed in a first resin,
wherein the second LED chip is sealed in a second resin,
wherein the third LED chip is sealed in a third resin, and
wherein the fourth LED chip is sealed in a fourth resin.

2. The LED light source according to claim 1,
wherein the first electrode surface of the first LED chip, the third electrode surface of the second LED chip, the fifth electrode surface of the third LED chip, and the seventh electrode surface of the fourth LED chip have a first polarity characteristic, and
wherein the second electrode surface of the first LED chip, the fourth electrode surface of the second LED chip, the sixth electrode surface of the third LED chip, and the eighth electrode surface of the fourth LED chip have a second polarity characteristic.

3. The LED light source according to claim 1,
wherein the first LED chip is a red LED, a blue LED, or a green LED,
wherein the second LED chip is a red LED, a blue LED, or a green LED,
wherein the third LED chip is a red LED, a blue LED, or a green LED, and wherein the fourth LED chip is a red LED, a blue LED, or a green LED, and the red LED, the green LED, and the blue LED are arbitrarily arranged.

4. The LED light source according to claim 3, wherein a ratio of a number of the red LED, the green LED, and the blue LED is 1:2:1.

5. The LED light source according to claim 3, wherein the first electrode has a surface, and wherein the red LED chip, the green LED chip, and the blue LED chip are mounted on the surface of the first electrode.

6. The LED light source according to claim 1, wherein the first, second, third, and fourth LED chips are white LED chips comprising blue LED chips covered with phosphors.

7. A liquid crystal display device comprising:
a liquid crystal display element including a lamination of a first polarizing plate, a liquid crystal element, a color filter, a second polarizing plate, and a half mirror; and
a backlight element including a board, a plurality of LED light sources on the board, a diffusion plate over the LED light sources, and a plurality of prism sheets on the diffusion plate,
wherein the LED lights sources comprise
a first electrode having a first side and a second side opposite to the first side;
a second and a fourth electrode arrayed along the first side of the first electrode;
a third and a fifth electrode arrayed along the along the second side of the first electrode;
a first LED chip having a first electrode surface and a second electrode surface opposite to the first electrode surface;
a second LED chip having a third electrode surface and a fourth electrode surface opposite to the third electrode surface;
a third LED chip having a fifth electrode surface and a sixth electrode surface opposite to the fifth electrode surface; and
a fourth LED chip having a seventh electrode surface and a eighth electrode surface opposite to the seventh electrode surface,
wherein the first LED chip and the third LED chip are arrayed along the first side of the first electrode,
wherein the second LED chip and the fourth LED chip are arrayed along the second side of the first electrode,
wherein the first electrode surface of the first LED chip, the third electrode surface of the second LED chip, the fifth electrode surface of the third LED chip, and the seventh electrode surface of the fourth LED chip are electrically connected to the first electrode,
wherein the second electrode surface of the first LED chip is electrically connected to the second electrode,
wherein the fourth electrode surface of the second LED chip is electrically connected to the third electrode,
wherein the sixth electrode surface of the third LED chip is electrically connected to the fourth electrode,
wherein the eighth electrode surface of the fourth LED chip is electrically connected to the fifth electrode,
wherein the first electrode, the second electrode, the third electrode, the first LED chip, and the second LED chip are aligned in a first direction,
wherein the first electrode, the fourth electrode, the fifth electrode, the third LED chip, and the fourth LED chip are aligned in the first direction,
wherein the first LED chip is sealed in a first resin,
wherein the second LED chip is sealed in a second resin,
wherein the third LED chip is sealed in a third resin, and
wherein the fourth LED chip is sealed in a fourth resin.

8. The LED light source according to claim 7, wherein the first electrode surface of the first LED chip, the third electrode surface of the second LED chip, the fifth electrode surface of the third LED chip, and the seventh electrode surface of the fourth LED chip have a first polarity characteristic, and
wherein the second electrode surface of the first LED chip, the fourth electrode surface of the second LED chip, the sixth electrode surface of the third LED chip, and the eighth electrode surface of the fourth LED chip have a second polarity characteristic.

9. The LED light source according to claim 7, wherein the first LED chip is a red LED, a blue LED, or a green LED,
wherein the second LED chip is a red LED, a blue LED, or a green LED,
wherein the third LED chip is a red LED, a blue LED, or a green LED, and
wherein the fourth LED chip is a red LED, a blue LED, or a green LED, and the red LED, the green LED, and the blue LED are arbitrarily arranged.

10. The LED light source according to claim 9, wherein a ratio of a number of the red LED, the green LED, and the blue LED is 1:2:1.

* * * * *